United States Patent
Fujiyoshi

(10) Patent No.: US 10,942,613 B2
(45) Date of Patent: Mar. 9, 2021

(54) INPUT DEVICE AND METHOD OF CONTROLLING THE SAME

(71) Applicant: ALPS ALPINE CO., LTD., Tokyo (JP)

(72) Inventor: Tatsumi Fujiyoshi, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/558,395

(22) Filed: Sep. 3, 2019

(65) Prior Publication Data

US 2019/0384457 A1   Dec. 19, 2019

Related U.S. Application Data

(63) Continuation of application No. PCT/JP2018/006537, filed on Feb. 22, 2018.

(30) Foreign Application Priority Data

Mar. 3, 2017 (JP) .............................. JP2017-040812

(51) Int. Cl.
*G06F 3/041* (2006.01)
*G06F 3/044* (2006.01)
*H03K 17/96* (2006.01)

(52) U.S. Cl.
CPC .......... *G06F 3/0446* (2019.05); *G06F 3/0445* (2019.05); *G06F 3/04166* (2019.05); *H03K 17/962* (2013.01); *H03K 2017/9613* (2013.01)

(58) Field of Classification Search
CPC ........ G06F 3/041; G06F 3/044; G06F 3/0446; G06F 17/96; G06F 17/9613; G06F 17/962

See application file for complete search history.

(56) References Cited

U.S. PATENT DOCUMENTS

2002/0101174 A1* 8/2002 Onozawa ............... G09G 3/296
                                                                            315/169.3
2014/0078104 A1* 3/2014 Lee ....................... G06F 3/0416
                                                                            345/174
(Continued)

FOREIGN PATENT DOCUMENTS

JP    2012-528393    11/2012
JP       5592948     9/2014
(Continued)

*Primary Examiner* — Joe H Cheng
(74) *Attorney, Agent, or Firm* — Hunton Andrews Kurth LLP

(57) ABSTRACT

Charge is periodically supplied to a detection electrode so that a first alternating current voltage is generated in the detection electrode, and a detection signal corresponding to the supplied charge is created. A second alternating current voltage having the same frequency and phase as the first alternating current voltage is applied to a plurality of driving electrodes. An amplitude pattern, which is a combination of the amplitudes of the second alternating current voltages to be applied to the plurality of driving electrodes is switched according to a predetermined series of amplitude patterns. In each amplitude pattern included in the series of amplitude patterns, the second alternating current voltage having a certain amplitude is applied to the remaining driving electrodes resulting from excluding one driving electrode, and the second alternating current voltage having an amplitude different from the remaining driving electrodes is applied to the one driving electrode.

12 Claims, 21 Drawing Sheets

(56) References Cited

U.S. PATENT DOCUMENTS

| | | | | |
|---|---|---|---|---|
| 2014/0152621 A1* | 6/2014 | Okayama | ............. | G06F 3/0416 |
| | | | | 345/174 |
| 2014/0176495 A1* | 6/2014 | Vlasov | ................ | G06F 3/03545 |
| | | | | 345/174 |
| 2015/0084911 A1* | 3/2015 | Stronks | ................ | G06F 3/0418 |
| | | | | 345/174 |
| 2016/0370930 A1* | 12/2016 | Katsuta | ................ | G06F 3/0416 |
| 2018/0032205 A1* | 2/2018 | Katsuta | ................ | G06F 3/0412 |
| 2019/0294297 A1* | 9/2019 | Sasai | ................... | G06F 3/04182 |

FOREIGN PATENT DOCUMENTS

| | | |
|---|---|---|
| JP | 2015-121958 | 7/2015 |
| JP | 2015121958 A * | 7/2015 |

\* cited by examiner

INPUT DEVICE AND METHOD OF CONTROLLING THE SAME

CLAIM OF PRIORITY

This application is a Continuation of International Application No. PCT/JP2018/006537 filed on Feb. 22, 2018, which claims benefit of Japanese Patent Application No. 2017-040812 filed on Mar. 3, 2017. The entire contents of each application noted above is incorporated herein by reference.

BACKGROUND OF THE INVENTION

1. Field of the Invention

Embodiments of present invention relates to an input device that inputs information corresponding to a change in capacitance that is caused by a change in the position of an object and to a method of controlling the input device, for example to an input device such as a touch panel or touch pad that detects a manipulation by a finger or pen.

2. Description of the Related Art

Generally, capacitive sensors used in touch pads, touch panels, and the like are classified into a mutual capacitance type and a self capacitance type. A sensor of mutual capacitance type detects a change in capacitance (specifically, mutual capacitance) between a driving electrode and a detection electrode. A sensor of self-capacitance type detects a change in capacitance (specifically, self-capacitance) between a detection electrode and the ground.

In a sensor of mutual capacitance type, a capacitor with mutual capacitance is formed between one detection electrode and each of a plurality of driving electrodes. Therefore, an object at one of a plurality of different positions can be detected with one detection electrode. This is advantageous in that the numbers of electrode wires and detection circuits are reduced. Since, however, mutual capacitance between the detection electrode and a driving electrode is usually several pF and a change in mutual capacitance due to the proximity of a finger or the like is several hundred fF or less, which is a further small value, a sensor of mutual capacitance type has a disadvantage that detection sensitivity is usually low.

Since a change in self-capacitance due to the proximity of a finger or the like is larger than a change in mutual capacitance, a sensor of self-capacitance type has an advantage that detection sensitivity is higher than in a sensor of mutual capacitance type. Since, however, it is not possible to identify the proximity position of an object on one detection electrode according to a change in self-capacitance, a sensor of self-capacitance type has a disadvantage that the numbers of electrode wires and detection circuits are increased in proportion to the number of detection positions.

Thus, the sensor of mutual capacitance type and the sensor of self-capacitance type each have both an advantage and a disadvantage. In Japanese Patent No. 5592948 below, therefore, a device is described that selectively executes detection of self-capacitance type and detection of mutual capacitance type to achieve both hover detection, in which high sensitivity is demanded, and touch detection in which multi-touch detection is demanded. In Japanese Unexamined Patent Application Publication No. 2015-121958, an input device is described that can concurrently perform detection of self-capacitance type and detection of mutual capacitance type and can output a detection signal in which results in both detections are included.

Since the device described in Japanese Patent No. 5592948 cannot concurrently perform detection of self-capacitance type and detection of mutual capacitance type, the device has a disadvantage that time taken to detect the proximity of a finger and time taken to identify the proximity position of the finger are prolonged.

In the device described in Japanese Unexamined Patent Application Publication No. 2015-121958, a plurality of driving electrodes are disposed so as to intersect one detection electrode and a capacitor having mutual capacitance is formed between the detection electrode and each of the plurality of driving electrodes. A driving voltage in phase with the voltage of the detection electrode is applied to part of the plurality of driving electrodes, and a driving voltage in opposite phase with the voltage of the detection electrode is applied to the remaining part of the plurality of driving electrodes. With the driving electrode having the opposite-phase driving voltage, a change in the voltage of the capacitor becomes larger than that of the driving electrode having the in-phase driving voltage, so the amount of charge to be supplied to the capacitor becomes larger. If the number of driving electrodes to which to apply an opposite-phase driving voltage increases, the amount of charge to be supplied to all capacitors for the detection electrode becomes large in a steady state in which a finger is not close to the detection electrode. The larger the amount of charge in the steady state is, the larger the offset component of a detection signal is, the offset component being obtained as a detection result for all capacitors for the detection electrode. When the offset component of the detection signal becomes large, a dynamic range in an amplifier that amplifies the detection signal is restricted, resulting in the disadvantage that detection sensitivity is lowered. This leads to a disadvantage in that detection sensitivity is lowered.

SUMMARY OF THE INVENTION

The present invention addresses the above situation by providing an input device that can concurrently perform detection of self-capacitance type and detection of mutual capacitance type and capable of obtaining superior detection sensitivity and also providing a method of controlling the input device.

A first aspect of the present invention relates to an input device that inputs information corresponding to a change in capacitance that is caused by a change in the position of an object in a detection area. This input device has: a detection electrode placed in the detection area; a plurality of driving electrodes placed in the detection area, a capacitor being formed between the detection electrode and each of the plurality of driving electrodes; a charge detecting unit that periodically supplies charge to the detection electrode so that a first alternating current voltage is generated in the detection electrode, and outputs a detection signal corresponding to the supplied charge; a driving unit that applies a second alternating current voltage, which has the same frequency and phase as the first alternating current voltage, to each of the plurality of driving electrodes, and is capable of changing the amplitude of the second alternating current voltage for each driving electrode; and a control unit that switches an amplitude pattern, which is a combination of the amplitudes of second alternating current voltages to be applied to each of the plurality of driving electrodes by the driving unit. The control unit switches the amplitude pattern according to a predetermined series of amplitude patterns. In each amplitude pattern included in the series, the control unit applies the second alternating current voltages having a certain amplitude to each of remaining driving electrodes resulting from excluding one driving electrode or a group of driving electrodes, and also applies the second alternating current voltage having a different amplitude from the remaining driving electrode to the one driving electrode or the group of driving electrodes.

According to this structure, since charge is periodically supplied from the charge detecting unit to the detection electrode, the first alternating current voltage is generated in the detection electrode. The second alternating current voltage, which has the same frequency and phase as the first alternating current voltage, is applied to each of the plurality of driving electrodes by the driving unit, a capacitor being formed between the detection electrode and each driving electrode. The amplitude pattern is a combination of the amplitudes of the second alternating current voltages applied to each of the plurality of driving electrodes. The amplitude pattern is switched according to a predetermined series of amplitude patterns.

When an object such as a finger comes close to the detection electrode, a capacitor is formed between the detection electrode and the object. When the capacitance (specifically, self-capacitance) of the capacitor changes according to the degree of the proximity between the detection electrode and the object, the amount of charge to be supplied from the charge detecting unit to the detection electrode changes and the detection signal changes accordingly. That is, a component involved in the self-capacitance between the detection electrode and the object is included in the detection signal. According to this component involved in self-capacitance, it makes possible to detect whether the object has come close to the detection electrode and the degree of proximity between the object and the detection electrode.

When the object comes close to the capacitor formed between the detection electrode and the driving electrode, the capacitance (specifically, mutual-capacitance) of the capacitor changes and the detection signal changes according to this change in the mutual-capacitance. That is, a component involved in the mutual-capacitance between the detection electrode and the object is included in the detection signal. In each amplitude pattern included in the series, the second alternating current voltage having a certain amplitude is applied to each of remaining driving electrodes resulting from excluding one driving electrode or a group of driving electrodes, and the second alternating current voltage having a different amplitude from the remaining driving electrodes is applied to the one driving electrode or group of driving electrodes. Therefore, there is a difference in an amount by which the detection signal changes according to a change in mutual-capacitance, between a case in which the object comes close to a capacitor formed between the detection electrode and the one driving electrode or the group of driving electrodes and a case in which the object comes close to a capacitor formed between the detection electrode and one of the remaining driving electrodes. Therefore, on the basis that the component, included in the detection signal, of mutual-capacitance varies depending on the amplitude pattern, it makes possible to identify that the object is close to which portion on the detection electrode.

Since the second alternating current voltage to be applied to the driving electrode and the first alternating current voltage generated in the detection electrode have the same frequency and the same phase, a change in the voltage of the capacitor formed between the driving electrode and the detection electrode is suppressed when compared with a case in which these phases are opposite to each other. When this change in the voltage of the capacitor becomes small, charge to be supplied to the capacitor becomes small regardless of whether the object is close, so the offset component of the detection signal becomes small. Therefore, the dynamic range of the detection signal due to a change in self-capacitance or mutual capacitance becomes less likely to be restricted by the offset component of the detection signal, so detection sensitivity can be easily increased.

Preferably, in each amplitude pattern included in the series, the control unit may apply, to the remaining driving electrodes, the second alternating current voltage having the same amplitude as the first alternating current voltage.

According to this structure, since the first alternating current voltage generated in the detection electrode and the second alternating current voltage to be applied to the remaining driving electrodes have the same amplitude, the amount of charge to be supplied to the capacitor formed between the detection electrode and one of the remaining driving electrodes becomes zero. Therefore, since charge to be supplied to the capacitor becomes small regardless of whether the object is close, the offset component of the detection signal becomes small.

Preferably, in each amplitude pattern included in the series, the control unit may apply, to one driving electrode or the group of driving electrodes, the second alternating current voltage having an amplitude larger than the amplitude of the first alternating current voltage.

According to this structure, the second alternating current voltage having an amplitude larger than the amplitude of the first alternating current voltage is applied to the one driving electrode or the group of driving electrodes. Therefore, the polarity of charge is opposite between when charge is supplied to the detection electrode according to a change in mutual capacitance between the detection electrode and the one driving electrode or the group of driving electrodes and when charge is supplied to the detection electrode according to a change in self-capacitance between the detection electrode and the object become opposite to each other. When the distance between the object and the detection electrode changes, a direction in which mutual capacitance changes and a direction in which self-capacitance changes becomes opposite to each other (if one becomes larger, the other becomes smaller). Therefore, if the distance between the object and the detection electrode changes, a direction in which charge to be supplied to the detection electrode changes according to a change in mutual capacitance and a direction in which charge to be supplied to the detection electrode changes according to a change in self-capacitance match. Due to this, as both changes in charge are not mutually cancelled, deterioration in the linearity of the detection signal with respect to the distance between the object and the detection electrode is suppressed.

Preferably, in each amplitude pattern included in the series, the control unit may apply, to one part included in the group of driving electrodes, the second alternating current voltage having an amplitude larger than the amplitude of the first alternating current voltage, and may also apply, to another part included in the group of driving electrodes, the second alternating current voltage having an amplitude smaller than the amplitude of the first alternating current voltage.

For example, in each amplitude pattern included in the series, the control unit may apply, to one of two driving electrodes around which the positions of the capacitors are adjacent, the second alternating current voltage having an amplitude larger than the amplitude of the first alternating current voltage, and may also apply, to the other of the two driving electrodes, the second alternating current voltage having an amplitude smaller than the amplitude of the first alternating current voltage.

According to this structure, polarities in a change in charge corresponding to a change in mutual capacitance are reverse between the one part of driving electrodes to which the second alternating current voltage having an amplitude larger than the amplitude of the first alternating current voltage is applied and the other part of the driving electrodes to which the second alternating current voltage having an amplitude smaller than the amplitude of the first alternating current voltage is applied. Therefore, it makes possible to obtain different detection signals for one driving electrode by using the amplitude patterns in which polarities in a change in charge corresponding to a change in mutual capacitance differ. Therefore, the different detection signals make possible to detect a change in mutual capacitance in the one driving electrode with superior sensitivity.

Since polarities in a change in charge corresponding to a change in mutual capacitance are reverse between the one part of driving electrodes and the other part of the driving electrodes, changes in charge between them are mutually cancelled and the whole of charge to be supplied to the detection electrode becomes small. Therefore, the offset component of the detection signal can be made small.

Preferably, in each amplitude pattern included in the series, the control unit may make a match between the number of driving electrodes in the group and the number of remaining driving electrodes, may make the amplitude of the second alternating current voltage to be applied to the group of driving voltages larger than the amplitude of the first alternating current voltage, and may make the amplitude of the second alternating current voltage to be applied to the remaining driving voltages smaller than the amplitude of the first alternating current voltage.

According to this structure, the amplitude of the second alternating current voltage to be applied to the group of driving voltages becomes larger than the amplitude of the first alternating current voltage, and the amplitude of the second alternating current voltage to be applied to the remaining driving voltages becomes smaller than the amplitude of the first alternating current voltage. Due to this, the polarity of charge is opposite between when charge is supplied to a capacitor formed between the detection electrode and one driving electrode in the group of driving electrodes and when charge to be supplied to a capacitor formed between the detection electrode and one of the remaining driving electrodes. Therefore, these charges are mutually cancelled. Furthermore, since the number of driving electrodes in the group and the number of remaining driving electrodes are equal to each other, the amount of charge to be supplied to capacitors formed between the detection electrode and all of the grope of driving electrodes and the amount of charge to be supplied to capacitors formed between the detection electrode and all of the remaining driving electrodes become nearly equal to each other and the sum of both charges becomes small. Therefore, since the total amount of charge to be supplied to these capacitors becomes small regardless whether the object is close, the offset component of the detection signal can be made small.

Preferably, each amplitude pattern included in the series may be any of a first amplitude pattern and a second amplitude pattern. When the amplitude pattern is a first amplitude pattern, the control unit may apply the second alternating current voltage having a first amplitude to the one driving electrode, and also apply the second alternating current voltage having a third amplitude to the remaining driving electrodes. When the amplitude pattern is a second amplitude pattern, the control unit may apply the second alternating current voltage having a second amplitude, which is smaller than the first amplitude, to the one driving electrode, and also apply the second alternating current voltage having the third amplitude to the remaining driving electrodes. The capacitors formed between the one driving electrode and the detection electrodes in the first amplitude pattern and the capacitors formed between the one driving electrode and the detection electrodes in the second amplitude pattern may be alternately arranged in detection area.

According to this structure, the amplitude of the second alternating current voltage to be applied to a capacitor differs depending on whether the capacitor is formed between the one driving electrode and the detection electrode in the first amplitude pattern (the capacitor is sometimes referred to below as the first capacitor) or the capacitor is formed between the one driving electrode and the detection electrode in the second amplitude pattern (the capacitor is sometimes referred to below as the second capacitor). Therefore, the amount of change in charge corresponding to change in the capacitance (specifically, mutual capacitance) of each capacitor differs. Since the first capacitors and the second capacitors are alternately arranged in the detection area, the first capacitors and the second capacitors that have a positional relationship in which they are mutually adjacent are present in the detection area. Therefore, information related to the extent to which the object is close at a position at which a first capacitor and a second capacitor are adjacent to each other is obtained according to the difference between the detection signal in the first amplitude pattern and that in the second amplitude pattern, the first amplitude pattern and second amplitude pattern forming a relationship in which first capacitors and second capacitors are adjacent to each other in the detection area.

Preferably, the input device described above may have a shield electrode placed adjacent to the detection electrode and a voltage generating unit that generates the first alternating current voltage and applies it to the shield electrode.

According to this structure, since the shield electrode is placed so as to be adjacent to the detection electrode, unnecessary capacitive coupling for the detection electrode is reduced. Since the shield electrode and the detection electrode are at the same voltage, charge is not supplied to a parasitic capacitor formed between the shield electrode and the detection electrode.

Preferably, the charge detecting unit may supply charge to the detection electrode so that the detection electrode and shield electrode have the same voltage, and may output the detection signal corresponding to the supplied charge.

Preferably, the input device may include a plurality of detection electrodes.

Preferably, the surface of the detection area may include a manipulation surface manipulated by a manipulator.

A second aspect of the present invention relates to a method of controlling an input device that inputs information corresponding to a change in capacitance that is caused by a change in the position of an object in a detection area. The input device has: a detection electrode placed in the detection area; a plurality of driving electrodes placed in the detection area, a capacitor being formed between the detection electrode and each of the plurality of driving electrodes; a charge detecting unit that periodically supplies charge to the detection electrode so that a first alternating current voltage is generated in the detection electrode, and outputs a detection signal corresponding to the supplied charge; and a driving unit that applies a second alternating current voltage, which has the same frequency and phase as the first alternating current voltage, to each of the plurality of driving electrodes, and is capable of changing the amplitude of the second alternating current voltage for each driving electrode. The method of controlling the input device has: switching an amplitude pattern, which is a combination of the amplitudes of the second alternating current voltages to be applied to each of the plurality of driving electrodes by the driving unit, according to a predetermined series of the amplitude patterns; and in each of the amplitude patterns constituting the series, applying the second alternating current voltage having a certain amplitude to each of remaining driving electrodes resulting from excluding one driving electrode or a group of driving electrodes, and also applying the second alternating current voltage having a different amplitude from the remaining driving electrode to the one driving electrode or the group of driving electrodes.

According to the present invention, it is possible to provide an input device that can concurrently perform detection of self-capacitance type and detection of mutual capacitance type and from which superior detection sensitivity can be obtained and to provide a method of controlling the input device.

DESCRIPTION OF THE PREFERRED EMBODIMENTS

First Embodiment

An input device according to a first embodiment of the present invention will be described below with reference to the drawings.

Figure 1:
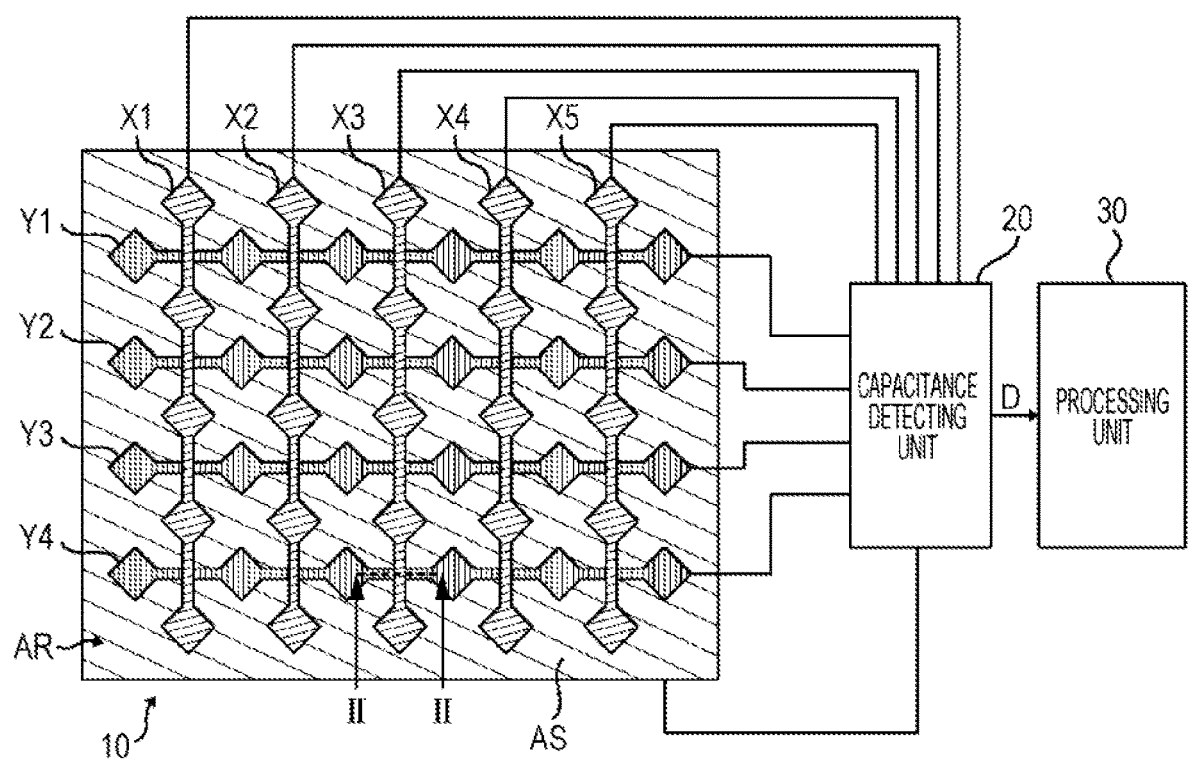
FIG. 1 illustrates an example of the structure of an input device according to an embodiment of the present invention.

FIG. 1 illustrates an example of the structure of an input device according to this embodiment. The input device illustrated in FIG. 1 has a sensor unit 10 the capacitance of which changes by causing an object such as a finger or pen to be closer thereto, a capacitance detecting unit 20 that detects a change in the capacitance of the sensor unit 10, and a processing unit 30. The input device according to this embodiment detects, in the capacitance detecting unit 20, a change in capacitance that is caused by a change in the position of an object in a detection area AR in the sensor unit 10, and inputs information corresponding to the detected change in capacitance. For example, the input device is a user interface device such as a touch pad or touch panel. A manipulation surface to be manipulated by a manipulator may be provided on the surface of the detection area AR.

Sensor Unit 10

The sensor unit 10 is configured so as to cause a change in capacitance at each of a plurality of detection positions in the detection area AR when an object such as a finger, a pen, or the like comes close. For example, the sensor unit 10 may have a plurality of detection electrodes (Y1 to Y4), a plurality of driving electrodes (X1 to X5), and a shield electrode AS placed adjacent to the detection electrodes (Y1 to Y4), these electrodes being placed in the detection area AR. In the example in FIG. 1, each detection electrode (Y1 to Y4) extends horizontally, and each driving electrode (X1 to X5) extends vertically. The plurality of detection electrodes (Y1 to Y4) are arranged vertically in parallel, and the plurality of driving electrodes (X1 to X5) are arranged horizontally in parallel. The plurality of detection electrodes (Y1 to Y4) and the plurality of driving electrodes (X1 to X5) are placed so as to intersect like a grid. In the vicinity of each intersection, a capacitor is formed between the detection electrode and the driving electrode. In the example in FIG. 1, a portion expanded in a rhombic shape is provided in the vicinity of each intersection between the detection electrode and the driving electrode so that a change in capacitance corresponding to a change in the position of the object in the detection area AR is likely to occur. Each of the detection electrodes (Y1 to Y4) and driving electrodes (X1 to X5) is connected to the capacitance detecting unit 20 via wiring.

Figure 2:
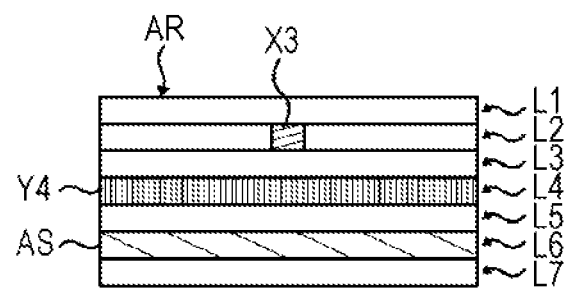
FIG. 2 exemplifies a cross-section of a sensor unit as taken along dotted line II-II in FIG. 1.

FIG. 2 exemplifies a cross-section of the sensor unit 10 as taken along dotted line II-II in FIG. 1.

In the example in FIG. 2, the sensor unit 10 has seven layers (L1 to L7), in which each open portion represents an insulating body. In case of a contact of an object, the uppermost layer L1, which is a manipulation surface in the detection area AR, is covered with an insulating body. The driving electrode X3, detection electrode Y4, and shield electrode AS are placed in that order, from the upper layer toward the lower layer. An layer of an insulating body is provided between the driving electrode X3 and the detection electrode Y4 and between the detection electrode Y4 and the shield electrode AS so that each electrode can take an electrically independent potential. In the example in FIG. 2, the driving electrode X3 is placed above the detection electrode Y4 (closer to the manipulation surface in the detection area AR). However, this placement may be reversed. In the example in FIG. 1, the driving electrodes (X1 to X5) are placed above the detection electrodes (Y1 to Y4) in the whole of the detection area AR. However, the up-down relationship of these electrodes may be partially reversed. In any case, the shield electrode AS is placed below the detection electrodes (Y1 to Y4) and driving electrodes (X1 to X5), that is, on a side distant from the manipulation surface in the detection area AR.

Figure 3:
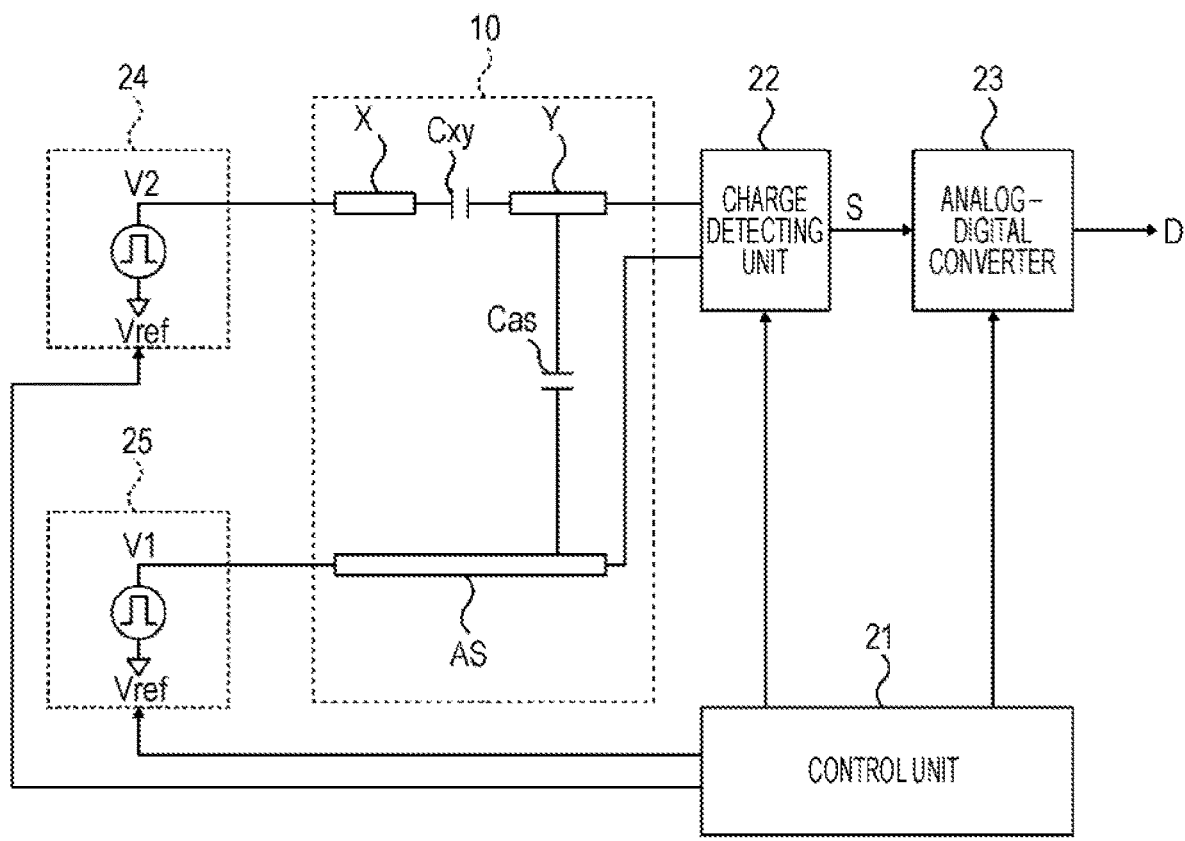
FIG. 3 illustrates an example of the structures of the sensor unit and a capacitance detecting unit.

FIG. 3 illustrates an example of the structures of the sensor unit 10 and capacitance detecting unit 20 in the input device according to this embodiment. The drawing indicates a circuit that detects capacitance for one detection electrode Y and one driving electrode X. The sign Y indicates any one of the plurality of detection electrodes (Y1 to Y4) and the sign X indicates any one of the plurality of driving electrodes (X1 to X5).

In FIG. 3, the sign Cxy indicates a capacitor between the driving electrode X and the detection electrode Y, the capacitor being formed in the vicinity of the intersection between the driving electrode X and the detection electrode Y, or indicates mutual capacitance, which is the capacitance of the capacitor. The sign Cas indicates a capacitor formed between the detection electrode Y and the shield electrode AS or indicates shield capacitance, which is the capacitance of the capacitor. Besides these capacitors, a capacitor Cfs is also formed between the detection electrode Y and the ground GND when an object such as a finger comes close. Self-capacitance, which is the capacitance of the capacitor Cfs, is also represented by the sign Cfs.

Capacitance Detecting Unit 20

The capacitance detecting unit 20 has a voltage generating unit 25 that applies a first alternating current voltage V1 to the shield electrode AS, a driving unit 24 that applies a second alternating current voltage V2 to each of the plurality of driving electrodes X, a charge detecting unit 22 connected to the detection electrode Y, an analog-digital converter 23, and a control unit 21.

The voltage generating unit 25 generates the first alternating current voltage V1, the level of which periodically changes, and applies the first alternating current voltage V1 to the shield electrode AS. In the description below, as an example, the waveform of the first alternating current voltage V1 will be assumed to be the waveform of a rectangular wave that periodically oscillates around a reference voltage Vref.

The driving unit 24 applies the second alternating current voltage V2, which has substantially the same frequency and phase as the first alternating current voltage V1, to each of the plurality of driving electrodes X. In the description below, as an example, the waveform of the second alternating current voltage V2 will also be assumed to be the waveform of a rectangular wave that periodically oscillates, centered around the reference voltage Vref, as with the first alternating current voltage V1. The driving unit 24 can change the amplitude of the second alternating current voltage V2 for each driving electrode X under control of the control unit 21, which will be described later.

The waveforms of the first alternating current voltage V1 and second alternating current voltage V2 are not limited to the waveform of rectangular wave, but may be the waveform of another periodic waveform such as a sine wave.

The charge detecting unit 22 periodically supplies charge to the detection electrode Y so that the same first alternating current voltage V1 as at the shield electrode AS is generated in the detection electrode Y, and outputs a detection signal S corresponding to the supplied charge.

Capacitors (specifically, Cas, Cxy, and the like) are formed between the shield electrode AS and the detection electrode Y and between the driving electrode X and the detection electrode Y, as illustrated in FIG. 3. Therefore, when the voltage of the shield electrode AS and the voltage of the driving electrode X change as a result of applying alternating current voltages (specifically, the first alternating current voltage V1 and second alternating current voltage V2) thereto, the voltage of the detection electrode Y also changes. The charge detecting unit 22 supplies positive or negative charge to the detection electrode Y so that the change in the voltage of the detection electrode Y and the change in the voltage of the shield electrode AS coincide with each other.

The amplitude of the first alternating current voltage V1 to be applied to the shield electrode AS is constant. The amplitude of the second alternating current voltage V2 to be applied to the driving electrode X is set under control of the control unit 21. Therefore, charge to be supplied from the charge detecting unit 22 to the detection electrode Y in response to one level change in the alternating current voltage (specifically, the first alternating current voltage V1 or second alternating current voltage V2) has a magnitude corresponding to the capacitance of a capacitor (for example, Cxy, Cfs, or the like) formed in the vicinity the detection electrode Y. Accordingly, the detection signal S corresponding to the charge from the charge detecting unit 22 is a signal corresponding to the capacitance of the capacitor (specifically, Cxy, Cfs, or the like) formed in the vicinity of the detection electrode Y.

Figure 4:
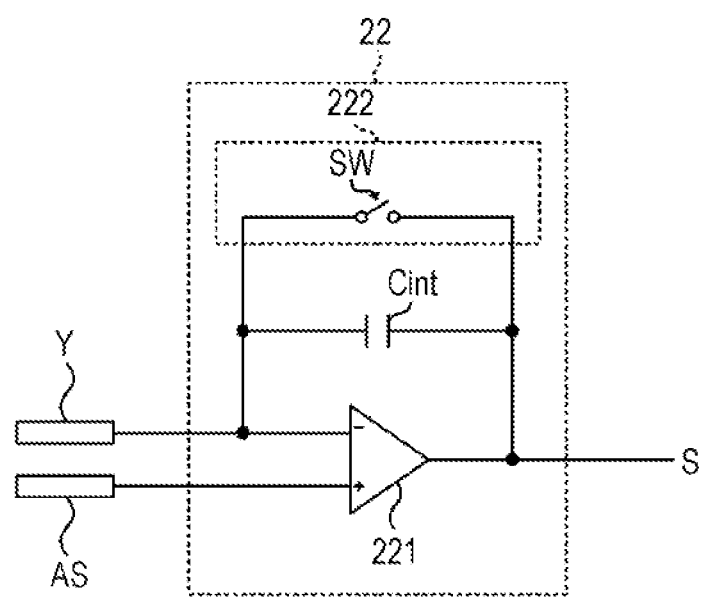
FIG. 4 illustrates an example of the structure of a charge detecting unit.

FIG. 4 illustrates an example of the structure of the charge detecting unit 22. The charge detecting unit 22 shown in FIG. 4 includes an operational amplifier 221, a charge reset circuit 222, and a capacitor Cint. The non-inverted input terminal of the operational amplifier 221 is connected to the shield electrode AS, and the inverted input terminal of the operational amplifier 221 is connected to the detection electrode Y. The capacitor Cint is disposed in a path between the output terminal and inverted terminal of the operational amplifier 221. The detection signal S is output from the output terminal of the operational amplifier 221.

The charge reset circuit 222 resets charge accumulated in the capacitor Cint when an amplitude pattern, which will be described later, is switched. The charge reset circuit 222 includes a switch SW connected in parallel to the capacitor Cint. The switch SW is turned on when the charge accumulated in the capacitor Cint is to be reset and is turned off during a period when the detection signal S is output.

One charge detecting unit 22 may be provided for each of the plurality of detection electrodes Y. Alternatively, the plurality of detection electrodes Y may be connected to one charge detecting unit 22 by using a switching circuit. When a plurality of charge detecting units 22 are provided, analog-digital converters 23 may be provided at post-stages of the plurality of charge detecting units 22, one for each charge detecting unit 22. Alternatively, the plurality of charge detecting units 22 may be connected to one analog-digital converter 23 by using a switching circuit.

The analog-digital converter 23 converts the detection signal S output from the charge detecting unit 22 to a digital signal D. The analog-digital converter 23 performs analog-digital conversion at, for example, a timing synchronous with a timing signal supplied from the control unit 21.

The control unit 21 controls the operation of units in the input device. For example, the control unit 21 may include hardware (for example, a logic circuit) configured so as to execute specific processing or may include a computer that executes processing according to software (that is, programs). The control unit 21 may execute all processing by hardware or may execute at least part of the processing by a computer and software.

The control unit 21 controls the amplitude of the second alternating current voltage V2 to be applied from the driving unit 24 to each of the plurality of driving electrodes X. Here, a combination of the amplitudes of second alternating current voltages V2 to be applied from the driving unit 24 to each of the plurality of driving electrodes X will be referred to as an amplitude pattern. The control unit 21 switches this amplitude pattern sequentially according to a predetermined series of amplitude patterns.

In each amplitude pattern included in the series of amplitude patterns, the control unit 21 may apply the second alternating current voltage V2 having a certain amplitude to each of remaining driving electrodes X resulting from excluding one driving electrode X, and may also apply the second alternating current voltage V2 having a different amplitude from the remaining driving electrodes X to the one driving electrode X. Specifically, in each amplitude pattern, the control unit 21 may apply, to one driving electrode X, the second alternating current voltage V2 having an amplitude VH larger than the amplitude of the first alternating current voltage V1, and also applies the second alternating current voltage V2 having the same amplitude VD as the first alternating current voltage V1 to the remaining driving electrodes X. By switching the amplitude pattern, the control unit 21 sequentially applies the second alternating current voltage V2 having the amplitude VH to all driving electrodes X.

The control unit 21 performs control to make the charge detecting unit 22 output the detection signal S in each amplitude pattern and to make the analog-digital converter 23 convert the detection signal S to a digital signal D. When switching one amplitude pattern to another amplitude pattern, the control unit 21 causes the charge reset circuit 222 to reset charge accumulated in the capacitor Cint in the charge detecting unit 22. After a switchover to a new amplitude pattern, the control unit 21 accumulates charge in the capacitor Cint placed in the reset state. In each amplitude pattern, the control unit 21 makes the analog-digital converter 23 convert the detection signal S output from the charge detecting unit 22 to a digital signal D.

Processing Unit 30

In each amplitude pattern, the processing unit 30 acquires a detected value SD corresponding to charge supplied from the charge detecting unit 22 to the detection electrode Y according the detection result (specifically, a digital signal D) by the capacitance detecting unit 20. To acquires the detected value SD corresponding to the amplitude of the digital signal D, the processing unit 30, for example, multiplies an alternating digital signal D output from the capacitance detecting unit 20 by an alternating reference signal synchronous with the first alternating current voltage V1 for each amplitude pattern and attenuates a high-frequency component included in a signal, which is a result of the multiplication, with a low-pass filter. The processing unit 30 calculates, for example, the coordinates of a position at which an object has come close, the size of the object (that is, a contact range), and the like according to the detected value SD obtained for each amplitude pattern. The processing unit 30 includes, for example, a computer that executes processing according to software. All of processing by the processing unit 30 may be executed by a computer and software, and at least part of the processing may be executed by specific hardware.

Operation of the Input Device

Here, the operation of the input device, according to this embodiment, that has the structure described above will be described.

Figure 5:
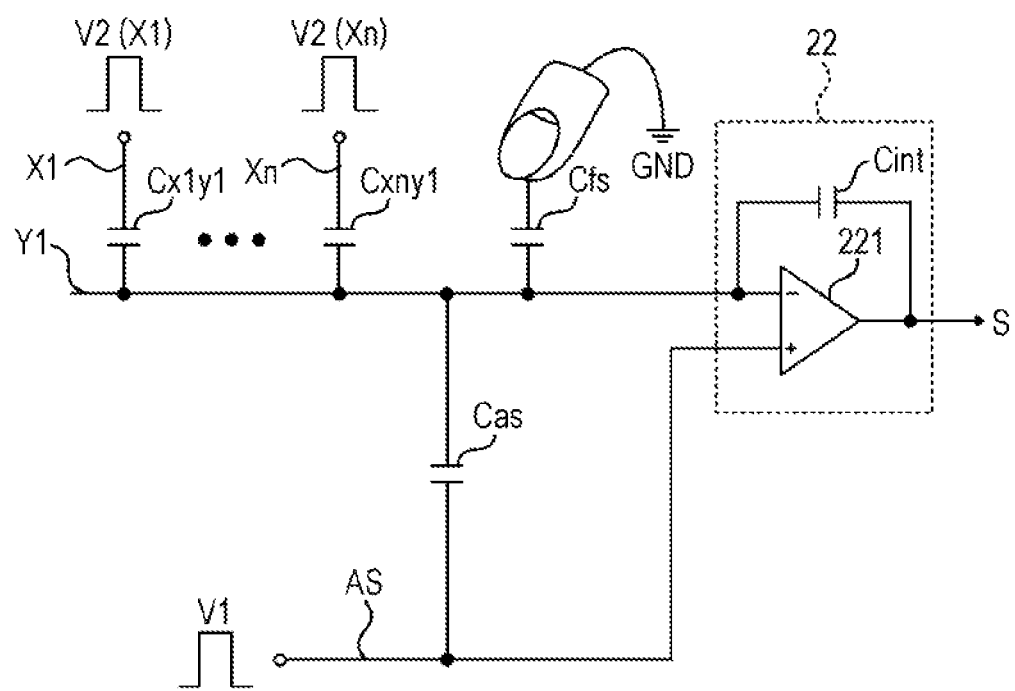
FIG. 5 illustrates an equivalent circuit in a case in which a finger has approached a detection electrode in the sensor unit.

FIG. 5 illustrates an equivalent circuit in a case in which a finger has approached the sensor unit 10. For simplicity, the analog-digital converter 23 and its post-stages are omitted in this drawing. For easy understanding, only capacitors in the vicinity of the detection electrode Y1 are illustrated. The sign $Cx1y1$ indicates a capacitor formed between the driving electrode X1 and the detection electrode Y1 and also indicates the capacitance of the capacitor. The sign $Cxny1$ indicates a capacitor formed between a driving electrode Xn and the detection electrode Y1 and also indicates the capacitance of the capacitor.

Usually, since the human body is linked to the ground GND with capacitance that is sufficiently larger than capacitance between the human body and a sensor at a time when the human body has come close to the sensor, a finger or another part of the human body can be regarded substantially as being the ground GND. Therefore, when a finger comes close to the detection electrode Y1, the self-capacitance Cfs of the finger is formed between the ground GND and the detection electrode Y1 as illustrated in FIG. 5. The magnitude of the self-capacitance Cfs of the finger varies with the distance when the finger comes close to the detection electrode Y1. The shorter the distance is, the larger the self-capacitance Cfs is.

Figure 6:
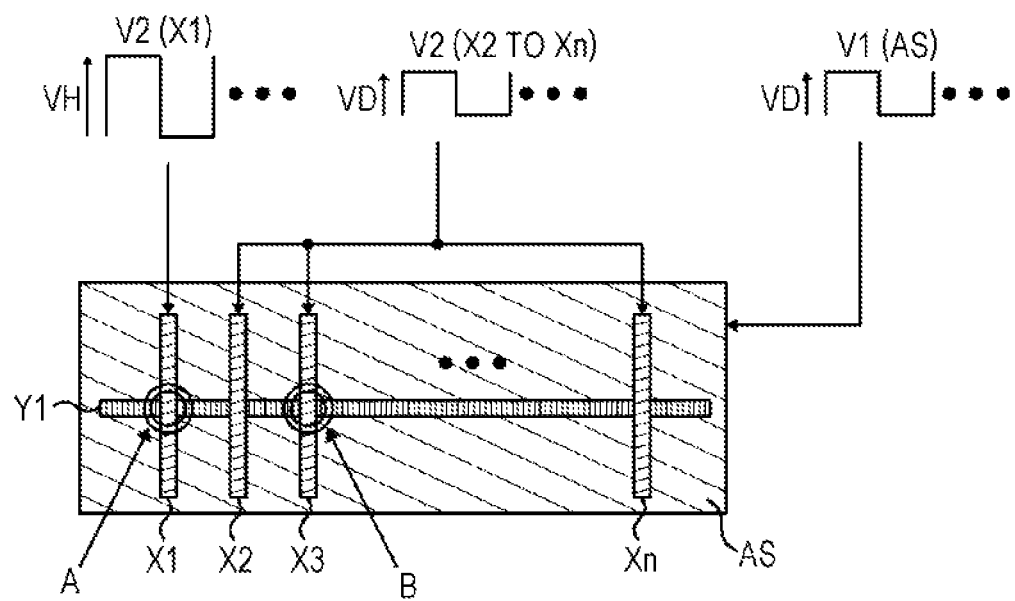
FIG. 6 illustrates an example of the amplitude pattern of second alternating current voltages in a first embodiment.

FIG. 6 illustrates an example of the amplitude pattern of the second alternating current voltage V2 in this embodiment. In the example in this drawing, n driving electrodes X1 to Xn are placed so as to intersect the detection electrode Y1. The shield electrode AS is placed below these electrodes. Although the driving electrodes X and detection electrode Y are schematically indicated in a strip shape, they are not limited to this shape. In the amplitude pattern illustrated in FIG. 6, the second alternating current voltage V2 having the amplitude VH larger than the amplitude of the first alternating current voltage V1 is applied to the driving electrode X1, and the second alternating current voltage V2 having the same amplitude VD as the first alternating current voltage V1 is applied to other driving electrodes X2 to Xn. The first alternating current voltage V1 having the amplitude VD is applied to the shield electrode AS. The second alternating current voltage V2 to be applied to the driving electrodes X2 to Xn has substantially the same frequency and phase as the first alternating current voltage V1 to be applied to the shield electrode AS.

In the example in FIG. 6, a case in which a finger is not close to the sensor unit 10 at all, a case in which a finger comes close to a portion A indicated by a double circle, and a case in which a finger comes close to a portion B indicated by a double circle will be respectively described with reference to FIGS. 7 to 9.

Figure 7:
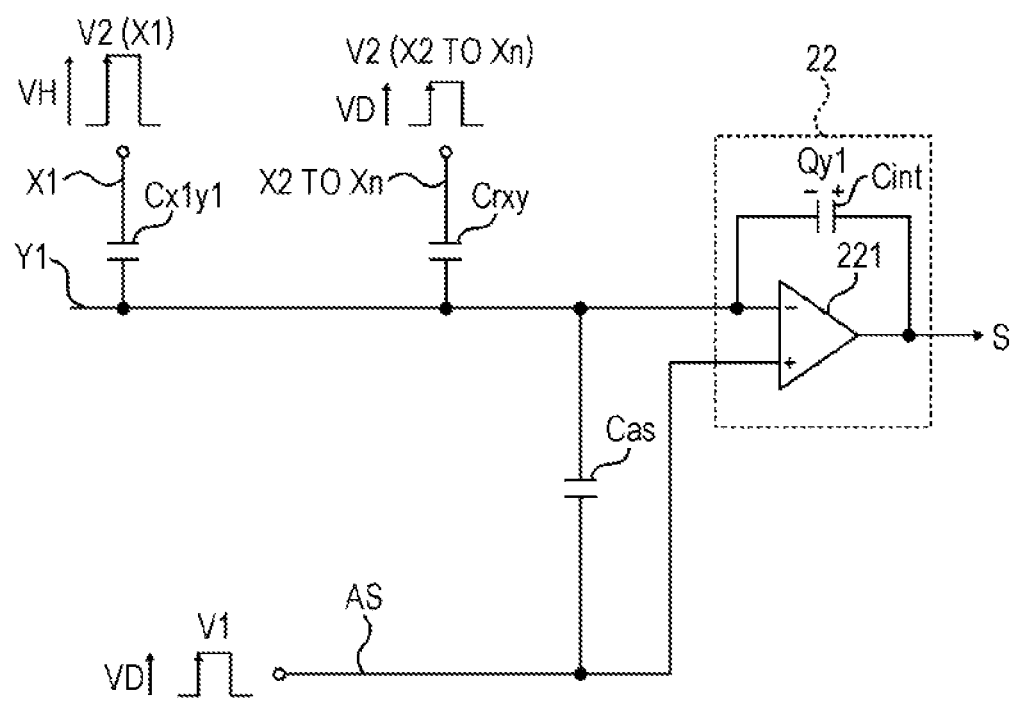
FIG. 7 illustrates an equivalent circuit in a state in which a finger is not close to the sensor unit.

First, an equivalent circuit in a state in which a finger is not close to the detection area AR is illustrated in FIG. 7. As the second alternating current voltages V2 having the same amplitude are applied to the driving electrodes X2 to Xn, n−1 capacitors formed between the detection electrode Y1 and the driving electrodes X2 to Xn are represented by one capacitor Crxy in FIG. 7. The capacitor Cas is formed between the detection electrode Y1 and the shield electrode AS. The detection electrode Y1 and the shield electrode AS are connected to the charge detecting unit 22 enclosed by the broken lines. The charge detecting unit 22 may output a detection signal S so that the detection electrode Y1 and shield electrode AS have substantially the same voltage, and may supply charge to the detection electrode Y1 through capacitor Cint. The charge detecting unit 22 outputs a detection signal S corresponding to the charge supplied to the detection electrode Y1.

As illustrated in FIG. 7, the second alternating current voltage V2, which is a rectangular wave having the amplitude VH, is applied to the driving electrode X1, the second alternating current voltage V2 having the amplitude VD is applied to each of the driving electrode X2 to Xn, and the first alternating current voltage V1 having the amplitude VD is applied to the shield electrode AS. The upward arrows in the rectangular waves in FIG. 7 indicate the same timing. When the voltages of these rectangular waves are applied to the respective relevant electrodes, positive charge flowing from the capacitor Cint in the charge detecting unit 22 toward the detection electrode Y1 at a timing of one edge indicated by an upward arrow (under the assumption that operation before it has subsided) will be denoted Qy1. In this case, as the detection electrode Y1 and shield electrode AS have substantially the same voltage due to the negative feedback operation of the charge detecting unit 22, no charge flows into the capacitor Cas. Since alternating current voltages having the same phase and the same amplitude are applied to the driving electrodes X2 to Xn and the shield electrode AS, no charge also flows into the capacitor Crxy. Therefore, charge Qy1 to be supplied from the charge detecting unit 22 to the detection electrode Y is represented as in the equation below by using the capacitance of the capacitor Cx1y1.

$$Qy1 = -(VH-VD) \times Cx1y1 \qquad (1)$$

The charge detecting unit 22 outputs a detection signal S corresponding to the charge Qy1 represented as in this equation (1).

Figure 8:
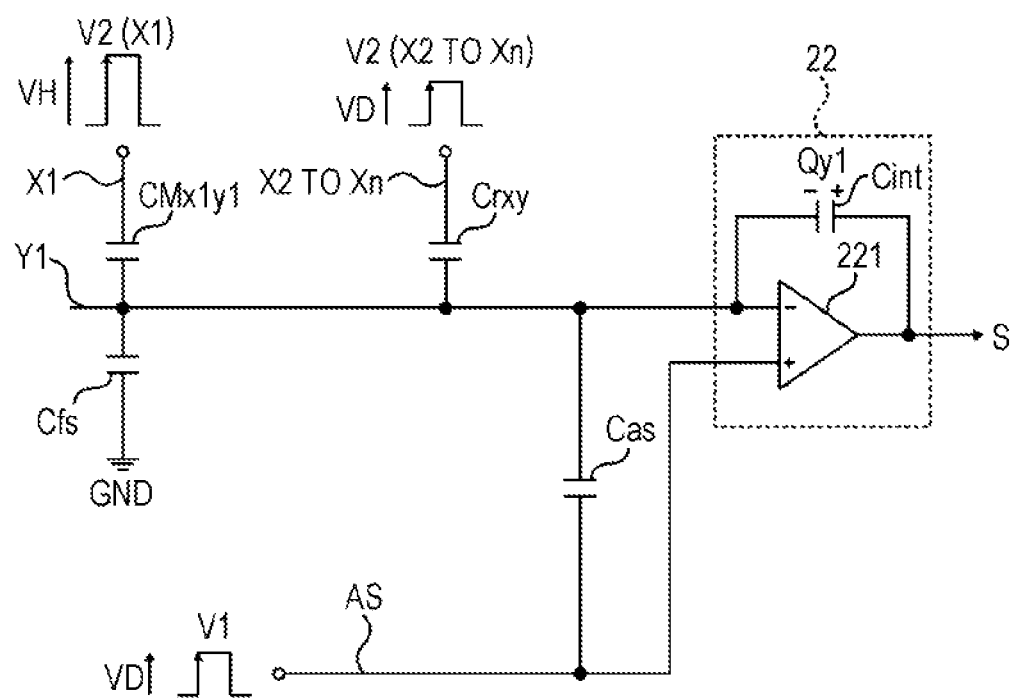
FIG. 8 illustrates an equivalent circuit in a state in which a finger comes close to a portion A in FIG. 6.

Next, an equivalent circuit in a state in which a finger comes close to the portion A in FIG. 6 is illustrated in FIG. 8. In this case, the self-capacitance Cfs of a finger is formed between the detection electrode Y1 and the ground GND. As the portion A is on the driving electrode X1, the mutual capacitance between the driving electrode X1 and the detection electrode Y1 is slightly lower than the mutual capacitance Cx1y1 at the time when a finger is not close.

Figure 10A:
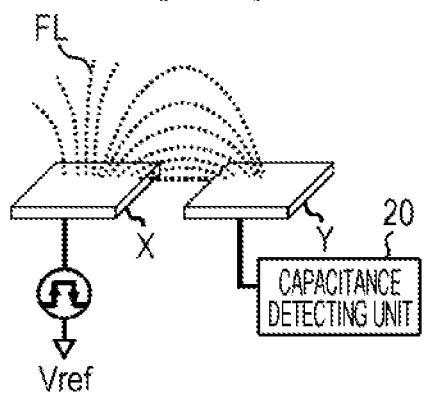
FIGS. 10A to 10D explain a reduction in mutual capacitance due to the proximity of a finger.
Figure 10C:
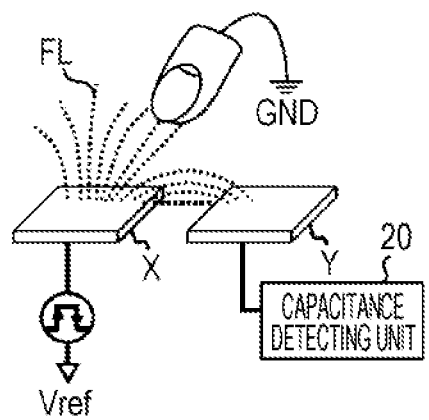
Figure 10B:
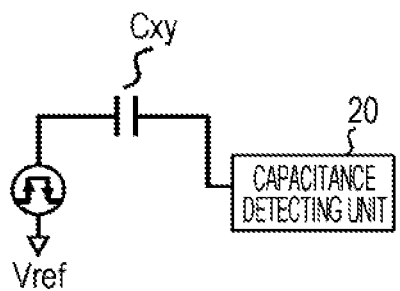

FIGS. 10A to 10D explain a reduction in mutual capacitance due to the proximity of a finger. FIG. 10A schematically represents electric force lines FL in a case in which there is a difference in potential between the driving electrode X and the detection electrode Y in a state in which a finger is not close. Since these two electrodes are arranged side by side spatially with an insulating body intervening between them, an equivalent circuit of capacitance can be represented as a capacitor having mutual capacitance Cxy as illustrated in FIG. 10B.

Figure 10D:
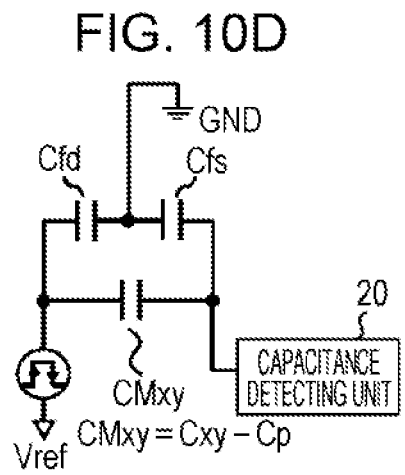

FIG. 10C is a drawing representing a state in which a finger has come close. In this case, a conductor having a potential equal to the ground GND is present in space between the driving electrode X and the detection electrode Y as illustrated in FIG. 10C. Therefore, part of the electric force lines FL, which expand between the driving electrode X and the detection electrode Y, becomes in a state of being shielded by the conductor having a potential equal to the ground GND. An equivalent circuit in this case is divided into a capacitor having mutual capacitance CMxy between the driving electrode X and the detection electrode Y, a capacitor having capacitance Cfd between the driving electrode X and the ground GND, and a capacitor having capacitance Cfs between the detection electrode Y and the ground GND, as illustrated in FIG. 10D. Therefore, the mutual capacitor CMxy in a case in which a finger comes close becomes smaller than the mutual capacitance Cxy in a case in which a finger is not close. That is, a relation in which Cxy is larger than CMxy is established.

If the difference between the mutual capacitance Cxy and the mutual capacitance CMxy is denoted Cp (=Cxy−CMxy), the mutual capacitance CMx1y1 in a case in which a finger comes close can be represented as Cx1y1−Cp. In this case, since a finger is not close at places other than A, the mutual capacitance between the detection electrode Y1 and each of the driving electrodes X2 to Xn remains unchanged at Crxy. When an alternating current voltage in the form of a rectangular wave having an amplitude as illustrated in the drawing is applied to the driving electrodes X1 and X2 to Xn and to the shield electrode AS, if positive charge flowing from the charge detecting unit 22 into the detection electrode Y1 at a timing of one edge indicated by an arrow is denoted Qy1', the charge Qy1' is represented by the equation below.

$$Qy1' = -(VH-VD) \times (Cx1y1-Cp) + VD \times Cfs \qquad (2)$$

Figure 9:
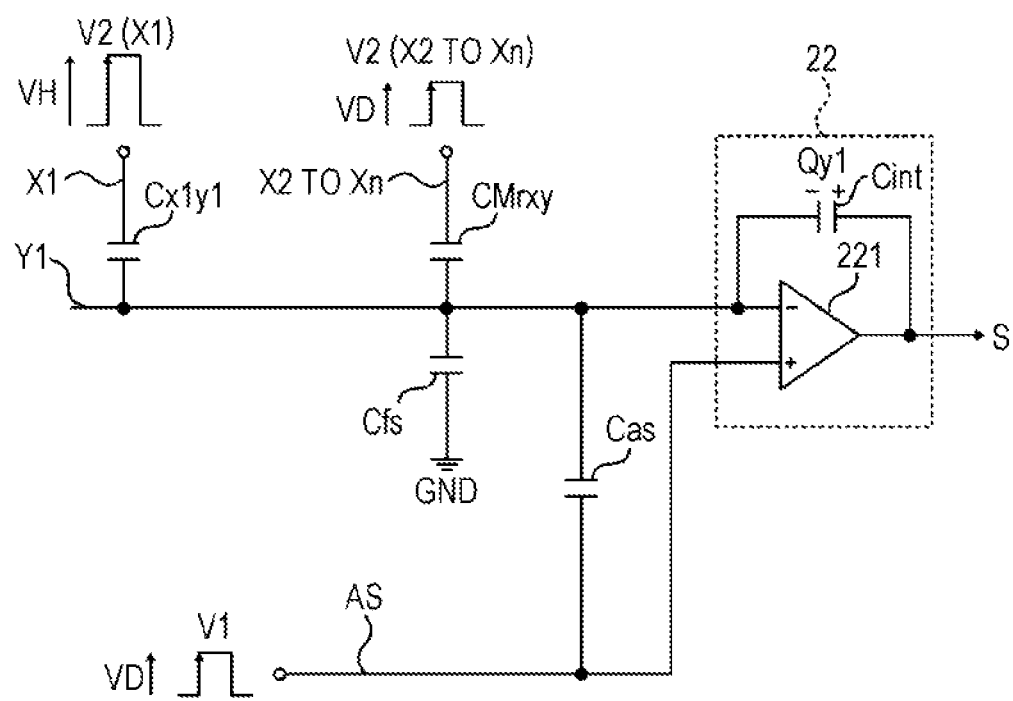
FIG. 9 illustrates an equivalent circuit in a state in which a finger comes close to a portion B in FIG. 6.

Next, an equivalent circuit in a state in which a finger comes close to the portion B in FIG. 6 is illustrated in FIG. 9.

In this case as well, since a finger comes close to the top of the detection electrode Y1, the mutual capacitance at that place is reduced. Unlike the case in FIG. 8, however, since the finger comes close to the driving electrode X2 different from the driving electrode X1, mutual capacitance CMrxy formed between the detection electrode Y1 and each of the driving electrodes X2 to Xn is smaller than mutual capacitance Crxy in the case in FIG. 8 by Cp (CMrxy=Crxy−Cp). When an alternating current voltage in the form of a rectangular wave having an amplitude as illustrated in the drawing is applied to the driving electrodes X1 and X2 to Xn and to the shield electrode AS, if positive charge flowing from the charge detecting unit 22 into the detection electrode Y1 at a timing of one edge indicated by an arrow is denoted Qy1", the charge Qy1" is represented by the equation below.

$$Qy1'' = -(VH-VD) \times Cx1y1 + VD \times Cfs \qquad (3)$$

The self-capacitance Cfs of a finger is larger than the difference Cp in mutual capacitance between when a finger has come close and when not. It is known that self-capacitance Cfs is three times or more as large as the difference Cp in mutual capacitance.

$$Cfs > Cp \qquad (4)$$

Since the amplitude VH is larger than the amplitude VD (VH>VD), the term VH−VD in equations (1) to (3) is positive. Therefore, in each of the state in which a finger is not close (see FIG. 7), the state in which a finger has come close to the portion A (see FIG. 8), and the state in which a finger has come close to the portion B (see FIG. 9), the following relation is established for positive charge that flows from the charge detecting unit 22 into the detection electrode Y1.

$$Qy1' > Qy1'' > Qy1 \qquad (5)$$

Since the relation in equation (5) is established, whether a finger is close to the detection electrode Y1 can be identified and whether the finger is close to the driving electrode X1 or any of the driving electrodes X2 to Xn can also be identified, according to the detection signal S, corresponding to charge supplied to the detection electrode Y1, from the charge detecting unit 22.

Figure 11:
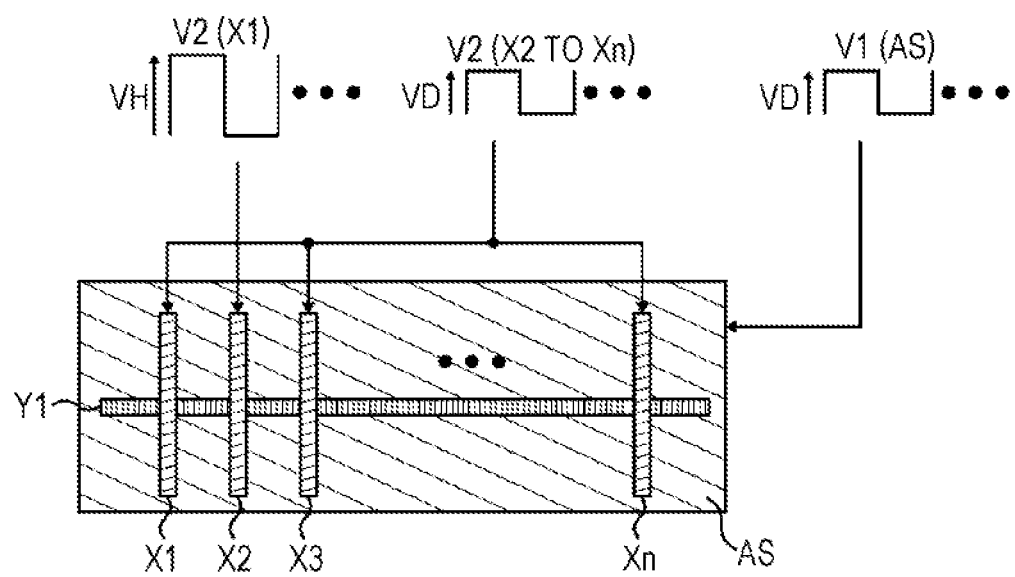
FIG. 11 illustrates an example of a next amplitude pattern switched after the amplitude pattern in FIG. 6.

FIG. 11 illustrates an example of a next amplitude pattern switched after the amplitude pattern in FIG. 6. In the example of the amplitude pattern illustrated in FIG. 11, the second alternating current voltage V2 having the amplitude VH larger than the amplitude of the first alternating current voltage V1 is applied to the driving electrode X2 and the second alternating current voltage V2 having the same amplitude VD as the first alternating current voltage V1 is applied to the remaining driving electrodes (X1 and X3 to Xn). That is, the driving electrode X to which to apply the second alternating current voltage V2 having the amplitude VH is shifted by one position horizontally. In the amplitude pattern in FIG. 11, it makes possible to identify whether a finger is close to the driving electrode X2 or a finger is close to any of the driving electrodes X1 and X3 to Xn. Subsequently, the driving electrode X to which to apply the second alternating current voltage V2 having the amplitude VH is similarly shifted horizontally each time the amplitude pattern is switched. It makes possible to identify the proximity position of the finger on the detection electrode Y1 according to the detection signal S obtained in each amplitude pattern. It makes possible to identify the two-dimensional proximity position of a finger in the detection area AR by the structure in FIG. 1 in which a plurality of detection electrodes Y are arranged vertically in parallel to Y1.

Comparison with the Method in Japanese Unexamined Patent Application Publication No. 2015-121958

Next, comparison with the method in Japanese Unexamined Patent Application Publication No. 2015-121958 will be described. If an alternating current voltage to be applied to each driving electrode X has been generated by a method similar to the method in Japanese Unexamined Patent Application Publication No. 2015-121958, an alternating current voltage to be applied to one driving electrode X has the same phase and amplitude (that is, the amplitude VD) as the alternating current voltage of the detection electrode Y, and an alternating current voltage to be applied to the remaining driving electrodes X has a phase opposite to the phase of the alternating current voltage of the detection electrode Y and has the same amplitude (that is, the amplitude VD) as the detection electrode Y. In this case, even in a state in which a finger is not close, the absolute value Qoff1 of charge to be constantly supplied to the detection electrode Y is represented by the equation below.

$$Qoff1 = 2 \times VD \times Crxy \quad (6)$$

In contrast to this, in the embodiment described above, the absolute value Qoff2 of charge that is constantly supplied to the detection electrode Y even in a state in which a finger is not close is represented by the equation below.

$$Qoff2 = (VH - VD) \times Cxy \quad (7)$$

As seen from a comparison between equation (6) and equation (7), a voltage change in the capacitor Crxy in the method in Japanese Unexamined Patent Application Publication No. 2015-121958 is 2×VD, which is twice as large as the amplitude VD of the alternating-current voltage to be applied to each electrode. The capacitance of the capacitor Crxy in the method in Japanese Unexamined Patent Application Publication No. 2015-121958 is larger (usually, 10 times or more) than the capacitance of the capacitor Cxy. With the input device in Japanese Unexamined Patent Application Publication No. 2015-121958, therefore, the offset component of the detection signal S becomes large when compared with the input device in this embodiment and the dynamic range of the detection signal S becomes small.

In a case in which an alternating current voltage to be applied to each driving electrode X is generated by a method similar to the method, described above, in Japanese Unexamined Patent Application Publication No. 2015-121958, it is assumed that a finger has come close to the driving electrode X to which an alternating current voltage had been applied that has a phase opposite to the phase of an alternating current voltage of the detection electrode Y and has the same amplitude (that is, the amplitude VD) as the detection electrode Y. In this case, a cancellation occurs between a change in charge due to a reduction caused in the capacitance Crxy of the driving electrode X when a finger has come close and a change in charge due to an increase caused in the self-capacitance Cfs of the detection electrode Y when the finger has come close. Therefore, linearity in a relationship between the detection signal S and the extent to which the finger comes close is deteriorated. As seen from equation (2), with the input device in this embodiment, when a finger comes close, the direction of a change in charge due to a reduction in the capacitance Crxy of the driving electrode X and the direction of a change in charge due to an increase in the self-capacitance Cfs of the detection electrode Y become the same direction. Therefore, the above deterioration in linearity is suppressed.

Relationship Between the Amplitude VH and the Amplitude VD

Values based on actual measurements are set for self-capacitance Cfs, mutual capacitance Cx1y1, and the change Cp in mutual capacitance, as follows.

Cfs=200 [fF], Cx1y1=400 [fF], Cp=50 [fF]

In a case in which each capacitance has the relevant value above, assuming that the amplitude VH is 1.5 times as large as the amplitude VD, equations (1) to (3) are rewritten as follows, respectively.

$$Qy1 = VD \times (200 \text{ [fF]}) \quad (8)$$

$$Qy1' = VD \times (25 \text{ [fF]}) \quad (9)$$

$$Qy1'' = 0 \quad (10)$$

The difference between the maximum value (Qy1') and minimum value (Qy1) of charge is represented by the following equation from equation (8) and equation (9).

$$Qy1' - Qy1 = VD \times (225 \text{ [fF]}) \quad (11)$$

In the case in which each capacitance has the relevant value above, assuming that the amplitude VH is twice as large as the amplitude VD, equations (1) to (3) are rewritten as follows, respectively.

$$Qy1 = -VD \times (400 \text{ [fF]}) \quad (12)$$

$$Qy1' = -VD \times (150 \text{ [fF]}) \quad (13)$$

$$Qy1'' = -VD \times (200 \text{ [fF]}) \quad (14)$$

The difference between the maximum value (Qy1') and minimum value (Qy1) of charge is represented by the following equation from equation (11) and equation (12).

$$Qy1' - Qy1 = VD \times (250 \text{ [fF]}) \quad (15)$$

As seen from a comparison between equation (11) and equation (15), sensitivity can be increased by enlarging the amplitude VH. If, for example, the amplitude VH is increased to 1.5 times the amplitude VD (VH=1.5 VD), the amplitude of the alternating current voltage to be applied to the capacitor Cxy with mutual capacitance becomes 0.5 VD.

If the amplitude VH is increased to twice the amplitude VD (VH=2 VD), the amplitude of the alternating current voltage to be applied to the capacitor Cxy with mutual capacitance becomes VD. Therefore, sensitivity is higher in the latter case than in the former case.

Empirically, if the driving voltage for mutual capacitance is 2.5 [V] or more, an S/N ratio necessary in a capacitance detecting circuit can be assured. In a capacitance detecting circuit for mutual capacitance, a power supply voltage of 3.0 to 3.3 [V] is usually used. A standard power supply voltage higher than it is 5.0 [V]. In typical applications, therefore, it is desirable that a power supply voltage to generate the second alternating current voltage V2 having the amplitude VD be 3.0 to 3.3 [V] and that a power supply voltage to generate the second alternating current voltage V2 having the amplitude VH be 5.0 [V]. Therefore, it is desirable that the amplitude VH be within the range of 1.5 times to twice the amplitude VD.

Variation of the First Embodiment

Figure 12:
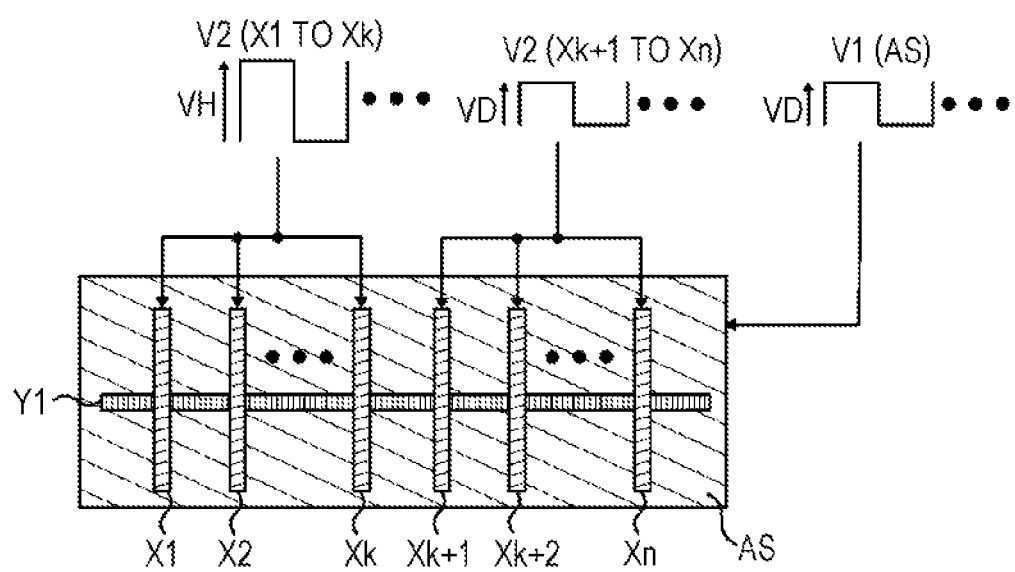
FIG. 12 illustrates another example of an amplitude pattern in the first embodiment.

In the examples in FIGS. 6 and 11, the second alternating current voltage V2 having the amplitude VH larger than the amplitude of the first alternating current voltage V1 has been applied to one driving electrode X and the second alternating current voltage V2 having the same amplitude VD as the first alternating current voltage V1 has been applied to the remaining driving electrodes X. However, the number of driving electrodes X to which to apply the second alternating current voltage V2 having the amplitude VH may be 2 or more. FIG. 12 illustrates an example in which the second alternating current voltage V2 having the amplitude VH is applied to a plurality of driving electrodes X. For example, the number of driving electrodes X to which to apply the second alternating current voltage V2 having the amplitude VH and the number of driving electrodes X to which to apply the second alternating current voltage V2 having the amplitude VD may be equal. In each amplitude pattern, a boundary between a driving electrode X to which to apply the second alternating current voltage V2 having the amplitude VH and a driving electrode X to which to apply the second alternating current voltage V2 having the amplitude VD is set at one place or two places. In this case as well, the proximity position of a finger can be identified by using a series of amplitude patterns in which the boundary between a driving electrode X to which to apply the second alternating current voltage V2 having the amplitude VH and a driving electrode X to which to apply the second alternating current voltage V2 having the amplitude VD is shifted by one position in each amplitude pattern to switch amplitude patterns.

Conclusion in the First Embodiment

With the input device according to this embodiment, the first alternating current voltage V1 is generated in the detection electrode Y by periodically supplying charge from the charge detecting unit 22 thereto. The second alternating current voltage V2 having the same frequency and phase as the first alternating current voltage V1 is applied to each of a plurality of driving electrodes X by the driving unit 24, the capacitor Cxy being formed between the detection electrode Y and each driving electrode X. An amplitude pattern, which is a combination of the amplitudes of the second alternating current voltages V2 to be applied to each of a plurality of driving electrodes X, is switched sequentially according to a predetermined series of amplitude patterns. When an object such as a finger comes close to the detection electrode Y, the capacitor Cfs is formed between the detection electrode Y and the object. When the capacitance (specifically, self-capacitance) of the capacitor Cfs changes in response to the degree of the proximity between the detection electrode Y and the object, the amount of charge to be supplied from the charge detecting unit 22 to the detection electrode Y changes, and the detection signal S changes accordingly. That is, a component involved in the self-capacitance between the detection electrode Y and the object is included in the detection signal S. Based on this component involved in self-capacitance, it is possible to detect whether an object has come close to the detection electrode Y and the degree of the proximity between the object and the detection electrode Y.

With the input device according to this embodiment, when an object comes close to the capacitor Cxy formed between the detection electrode Y and the driving electrode X, the capacitance (specifically, mutual capacitance) of the capacitor Cxy changes and the detection signal S changes in response to this change in the mutual capacitance. That is, a component involved in mutual capacitance between the detection electrode Y and the object is also included in the detection signal S. In each amplitude pattern included in a series of amplitude patterns, the second alternating current voltage V2 having a certain amplitude is applied to each of remaining driving electrodes X resulting from excluding one driving electrode X (or a group of driving electrodes X), and the second alternating current voltage V2 having a different amplitude from the remaining driving electrodes X is applied to the one driving electrode X (or the group of driving electrodes X). Therefore, there is a difference in an amount by which the detection signal S changes according to a change in mutual capacitance, between a case in which an object comes close to the capacitor Cxy formed between the detection electrode Y and one driving electrode X (or a group of driving electrodes X) and a case in which the object comes close to the capacitor Cxy formed between the detection electrode Y and one of the remaining driving electrodes X. Therefore, on the basis that the component, included in the detection signal S, of mutual capacitance varies depending on the amplitude pattern, it is possible to identify that the object is close to which portion on the detection electrode Y.

With the input device according to this embodiment, therefore, it is possible to concurrently perform detection of self-capacitance type and detection of mutual capacitance type.

With the input device according to this embodiment, since the second alternating current voltage V2 to be applied to the driving electrode X and the first alternating current voltage V1 generated in the detection electrode Y have the same frequency and the same phase, a change in the voltage of the capacitor Cxy formed between the driving electrode X and the detection electrode Y is suppressed in comparison with a case that these phases are opposite to each other. When this change in the voltage of the capacitor Cxy becomes small, charge to be supplied to the capacitor Cxy becomes small regardless of whether an object is close, so the offset component of the detection signal S becomes small. Accordingly, the dynamic range of the detection signal S due to a change in self-capacitance or mutual capacitance becomes less likely to be restricted by the offset component of the detection signal S, so detection sensitivity can be easily increased.

According to the input device of the present embodiment, since the first alternating current voltage V1 generated in the detection electrode Y and the second alternating current voltage V2 to be applied to the remaining driving electrodes X have the same amplitude, the amount of charge to be supplied to the capacitor Cxy formed between the detection electrode Y and one of the remaining driving electrodes X becomes zero. Therefore, since charge to be supplied to the capacitor Cxy becomes small regardless of presence of proximity of an object, the offset component of the detection signal S becomes small.

According to the input device of the present embodiment, the second alternating current voltage V2 having the amplitude VH larger than the amplitude of the first alternating current voltage V1 is applied to one driving electrode X (or a group of driving electrodes X). Therefore, the polarity of charge is opposite between when the charge is supplied to the detection electrode Y according to a change in mutual capacitance between the detection electrode Y and the one driving electrode X (or the group of driving electrodes X) and when the charge is supplied to the detection electrode Y according to a change in self-capacitance between an object and the detection electrode Y (see equation (2)). When the distance between the object and the detection electrode Y changes, a direction in which mutual capacitance changes and a direction in which self-capacitance changes becomes opposite to each other (if one becomes large, the other becomes small). Therefore, if the distance between the object and the detection electrode Y changes, a direction in which charge to be supplied to the detection electrode Y changes according to the change in mutual capacitance and a direction in which charge to be supplied to the detection electrode Y changes according to the change in self-capacitance become the same direction. Due to this, as both changes in charge are not mutually cancelled, it is possible to suppress deterioration in the linearity of the detection signal S with respect to the distance between the object and the detection electrode Y.

According to the input device of the present embodiment, the polarity of charge is opposite between when the charge is supplied to the detection electrode Y according to mutual capacitance between the detection electrode Y and one driving electrode X (or a group of driving electrodes X) to which the second alternating current voltage V2 having the amplitude VH is applied and when the charge is supplied to the detection electrode Y according to parasitic capacitance between the detection electrode Y and the ground GND. Therefore, as charge according to the parasitic capacitance is cancelled and thereby becomes small, the offset component of the detection signal S caused by the parasitic capacitance can be reduced.

Second Embodiment

Next, a second embodiment of the present invention will be described. An input device according to the second embodiment has a structure similar to that of the input device (see FIGS. 1 to 4) according to the first embodiment. A difference between them is in the amplitude pattern, set by the control unit 21, of the second alternating current voltage V2.

Figure 13:
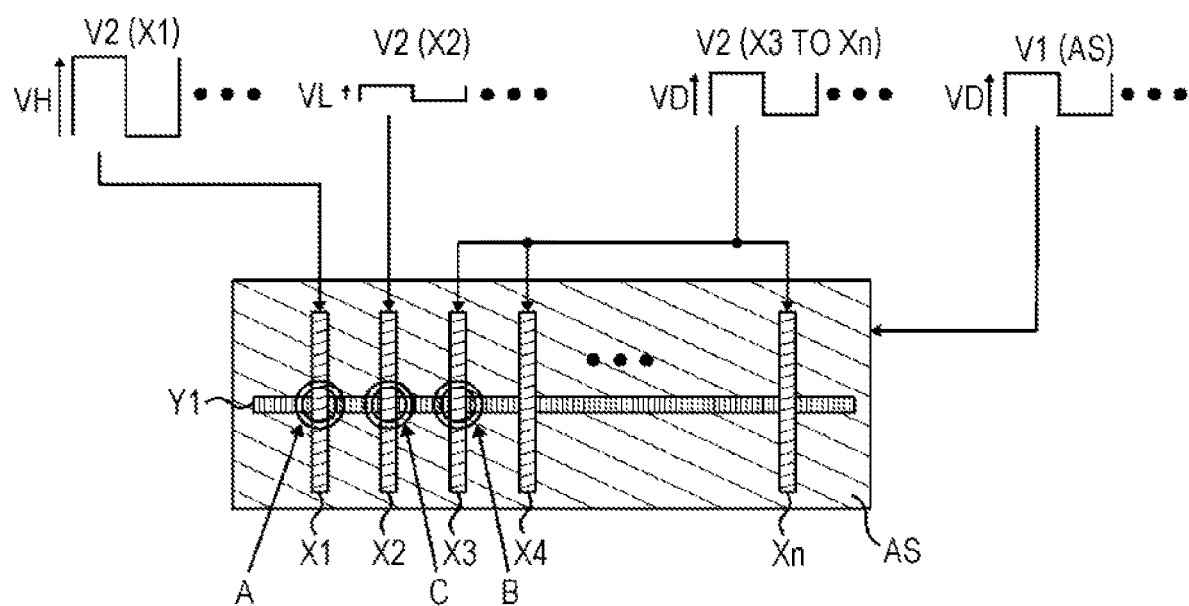
FIG. 13 illustrates an example of an amplitude pattern in a second embodiment.

FIG. 13 illustrates an example of the amplitude pattern of the second alternating current voltage V2 in the input device according to this embodiment. In an amplitude pattern P1 illustrated in this drawing, the control unit 21 applies the second alternating current voltage V2 having the amplitude VH larger than the amplitude of the first alternating current voltage V1 to the driving electrode X1, applies the second alternating current voltage V2 having an amplitude VL smaller than the amplitude of the first alternating current voltage V1 to the driving electrode X2, and applies the second alternating current voltage V2 having the same amplitude VD as the first alternating current voltage V1 to the remaining driving electrodes X3 to Xn. Of these amplitudes, the amplitude VH is largest, followed by the amplitude VD and amplitude VL in that order. Two driving electrodes X (X1 and X2) to which the second alternating current voltages V2 having the amplitude VH and amplitude VL are applied are an example of a group of driving electrodes in the present invention. The capacitor $Cx1y1$ formed between the driving electrode X1 and the detection electrode Y1 is adjacent to the capacitor $Cx2y1$ formed between the driving electrode X2 and the detection electrode Y1.

When, in the amplitude pattern P1, a finger is not close to the detection area AR, positive charge QAy1 that flows from the charge detecting unit 22 into the detection electrode Y1 on one rising edge of an alternating current voltage (that is, the first alternating current voltage V1 or second alternating current voltage V2) is represented by the equation below.

$$QAy1 = -(VH-VD) \times Cx1y1 - (VL-VD) \times Cx2y1 \quad (16)$$

When, in the amplitude pattern P1, a finger comes close to A (that is, the intersection between the driving electrode X1 and the detection electrode Y1), positive charge QAy1' that flows from the charge detecting unit 22 into the detection electrode Y1 on one edge of the alternating current voltage is represented by the equation below.

$$QAy1' = -(VH-VD) \times (Cx1y1-Cp) - (VL-VD) \times Cx2y1 + VD \times Cfs \quad (17)$$

When, in the amplitude pattern P1, a finger comes close to B (that is, the intersection between the driving electrode X3 and the detection electrode Y1), positive charge QAy1'' that flows from the charge detecting unit 22 into the detection electrode Y1 on one edge of the alternating current voltage is represented by the equation below.

$$QAy1'' = -(VH-VD) \times Cx1y1 - (VL-VD) \times Cx2y1 + VD \times Cfs \quad (18)$$

When, in the amplitude pattern P1, a finger comes close to C (hat is, the intersection between the driving electrode X2 and the detection electrode Y1), positive charge QAy1''' that flows from the charge detecting unit 22 into the detection electrode Y1 on one edge of the alternating current voltage is represented by the equation below.

$$QAy1''' = -(VH-VD) \times Cx1y1 - (VL-VD) \times (Cx2y1-Cp) + VD \times Cfs \quad (19)$$

Equation (16), equation (17), and equation (18) are equal to equations in which the term $-(VL-VD) \times Cx2y1$ is added to right sides of equation (1), equation (2), and equation (3), respectively. Since the amplitude VL is smaller than the amplitude VD, this term has a positive value. Therefore, charge (QAy1, QAy1', and QAy1'') in a case in which a finger is not close to C is substantially equal to charge obtained by adding a fixed offset component to charge obtained in the input device in the first embodiment.

Since equation (19) in a case in which a finger is close to C is obtained by reducing mutual capacitance in the second term in the right side of equation (18) from $Cx2y1$ to $Cx2y1-Cp$, charge QAy1''' is smaller than QAy1''. Since self-capacitance Cfs is sufficiently larger than mutual capacitance $Cx2y1$, charge QAy1''' is larger than QAy1. In each of the above states, therefore, the following relation is established for positive charge that flows from the charge detecting unit 22 into the detection electrode Y1.

$$QAy1' > QAy1'' > QAy1''' > QAy1 \quad (20)$$

Figure 14:
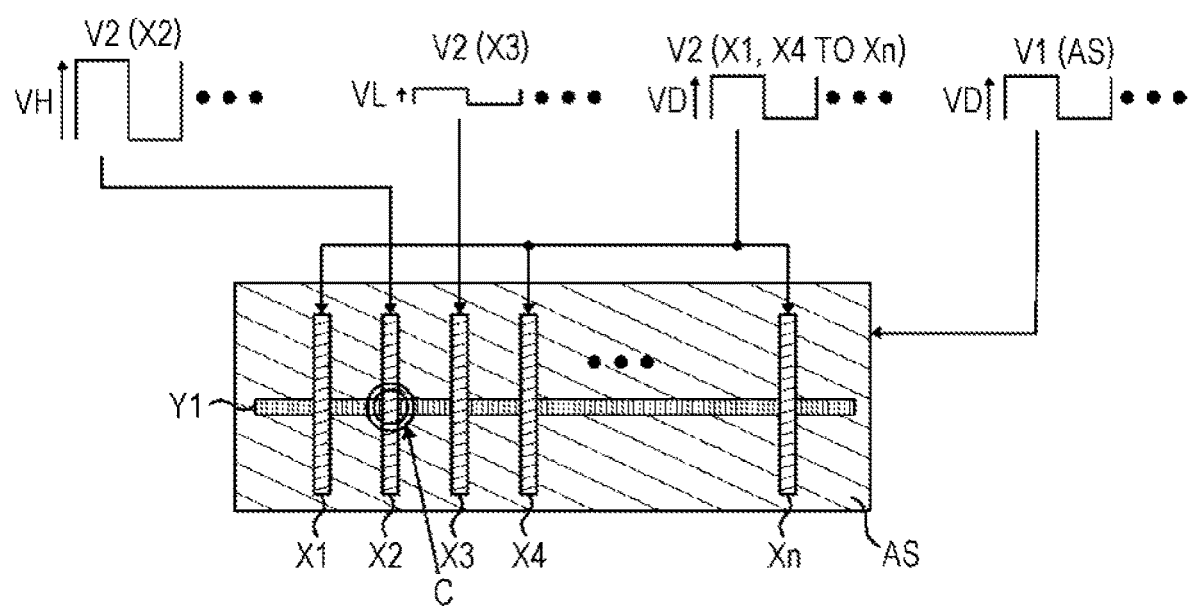
FIG. 14 illustrates an example of a next amplitude pattern switched after the amplitude pattern in FIG. 13.

FIG. 14 illustrates an example of a next amplitude pattern P2 switched after the amplitude pattern P1 in FIG. 13. In the amplitude pattern P2, the second alternating current voltage V2 having the amplitude VH is applied to the driving electrode X2, the second alternating current voltage V2 having the amplitude VL is applied to the driving electrode X3, and the second alternating current voltage V2 having the amplitude VD is applied to the remaining driving electrodes X1 and X4 to Xn. That is, due to a switchover from the amplitude pattern P1 to P2, two driving electrodes X (or a group of driving electrodes X) to which the second alternating current voltages V2 having the amplitudes VH and VD are applied are shifted by one position horizontally. Assuming that mutual capacitance Cxy and its change Cp are substantially uniform, charge in a case in which a finger comes close to C in the amplitude pattern P2 becomes a value close to charge QAy1' (see equation (17)) in a case in which a finger comes close to A in the amplitude pattern P1. Subsequently, the group of driving electrodes X is similarly shifted horizontally each time the amplitude pattern is switched.

Figure 15:
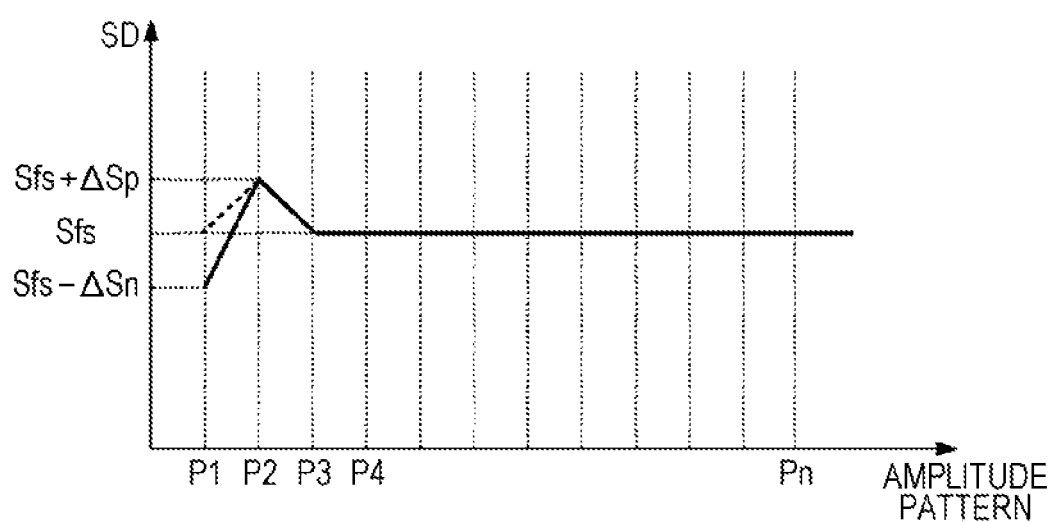
FIG. 15 illustrates an example of detected values that change according to the amplitude pattern.

FIG. 15 indicates an example of detected values SD that change according to the amplitude pattern and also indicates detected values SD in a case in which a finger is close to the position C in FIGS. 13 and 14. The detected value SD is a data value acquired in the processing unit 30 according to a detection result in the capacitance detecting unit 20. The detected value SD has a value corresponding to charge to be supplied from the charge detecting unit 22 to the detection electrode Y.

Sfs in FIG. 15 indicates the detected value SD in a case in which a finger has come close to the intersection (that is, the capacitor) between the detection electrode Y and the driving electrode X to which the second alternating current voltage V2 having the amplitude VD has been applied, and corresponds to QAy1" in equation (18). In an amplitude pattern P3 and later, the detected value SD becomes a value substantially close to Sfs.

Sfs−ΔSn in FIG. 15 indicates the detected value SD in a case in which a finger has come close to the intersection (that is, the capacitor) between the detection electrode Y and the driving electrode X to which the second alternating current voltage V2 having the amplitude VL has been applied, and corresponds to QAy1''' in equation (19). ΔSn corresponds to the difference between charge QAy1" and charge QAy1'''. In the amplitude pattern P1, the detected value SD becomes Sfs−ΔSn.

Sfs+ΔSp in FIG. 15 indicates the detected value SD in a case in which a finger has come close to the intersection (that is, the capacitor) between the detection electrode Y and the driving electrode X to which the second alternating current voltage V2 having the amplitude VH has been applied, and corresponds to QAy1' in equation (17). ΔSp corresponds to the difference between charge QAy1' and charge QAy1". In the amplitude pattern P2, the detected value SD becomes Sfs+ΔSp.

The dotted line in FIG. 15 indicates a case in which the difference between the amplitude VL and the amplitude VD is zero (VL=VD). In this case, the difference in the detected value SD between the amplitude pattern P1 and the amplitude pattern P2 becomes ΔSp. By making the amplitude VL smaller than amplitude VD, the difference in the detected value SD between the amplitude pattern P1 and the amplitude pattern P2 expands to ΔSp+ΔSn as indicated by a solid line in FIG. 15. That is, when there is a portion to which a finger is close, a change in the detected value SD accompanying a switchover between amplitude patterns is emphasized.

As described above, with the input device according to this embodiment, the second alternating current voltage V2 having the amplitude VH larger than the amplitude of the first alternating current voltage V1 may be applied to one part of a group of driving electrodes X to which the second alternating current voltage V2 having a different amplitude from the first alternating current voltage V1 is applied, and the second alternating current voltage V2 having the amplitude VL smaller than the amplitude of the first alternating current voltage V1 may be applied to another part of driving electrodes X. Due to this, a polarity of a change in charge corresponding to a change in mutual capacitance Cxy is opposite between one part of driving electrodes X to which the second alternating current voltage V2 having the amplitude VH has been applied and another part of driving electrodes X to which the second alternating current voltage V2 having the amplitude VL has been applied (see equation (17) and equation (19)). Therefore, it makes possible to obtain different detection signals S (that is, detected values SD) for one driving electrode X by using amplitude patterns having different polarities of a change in charge corresponding to a change in mutual capacitance Cxy. Therefore, by comparing these different detection signals S (that is, detected values SD), it makes possible to detect a change in mutual capacitance Cxy due to the proximity of an object with superior sensitivity and to enhance precision with which the position of an object is detected.

With the input device according to this embodiment, since a polarity of a change in charge corresponding to a change in mutual capacitance Cxy is opposite between one part of driving electrodes X to which the second alternating current voltage V2 having the amplitude VH has been applied and another part of driving electrodes X to which the second alternating current voltage V2 having the amplitude VL has been applied, changes in charge between them are mutually cancelled and the whole of charge to be supplied to the detection electrode Y becomes small. Therefore, the offset component of the detection signal S can be made small.

Third Embodiment

Next, a third embodiment of the present invention will be described. An input device according to the third embodiment also has a structure similar to that of the input device (see FIGS. 1 to 4) according to the first embodiment. A difference between them is in the amplitude pattern, set by the control unit 21, of the second alternating current voltage V2.

Figure 16:
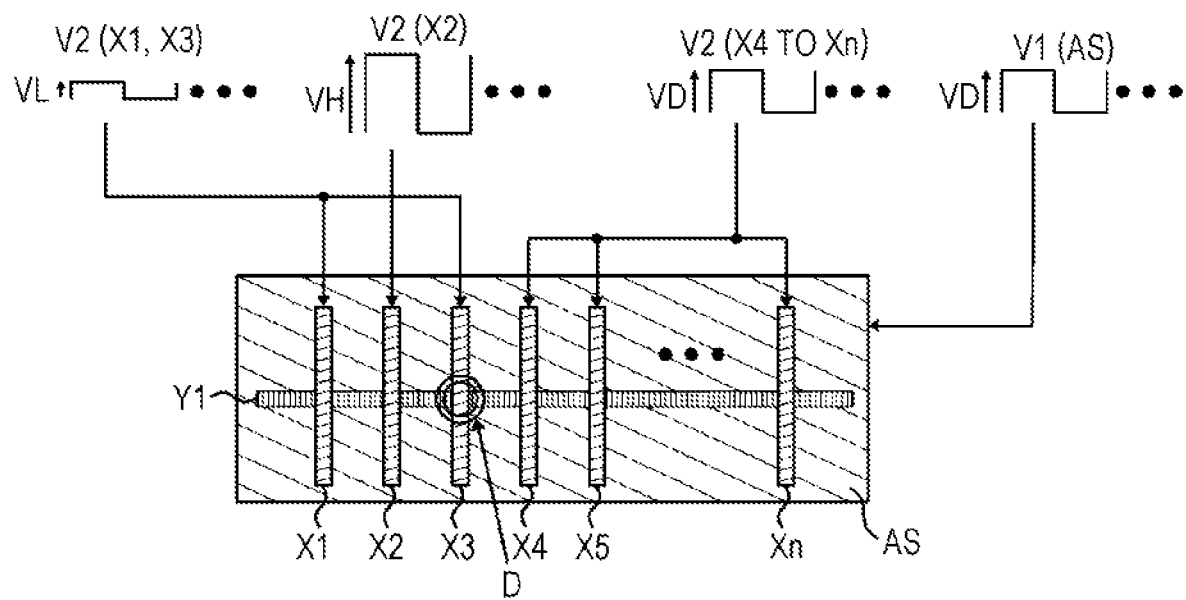
FIG. 16 illustrates an example of an amplitude pattern in a third embodiment.

FIG. 16 illustrates an example of the amplitude pattern of the second alternating current voltage V2 in the input device according to this embodiment. In the amplitude pattern P1 illustrated in FIG. 16, the control unit 21 applies the second alternating current voltage V2 having the amplitude VH larger than the amplitude of the first alternating current voltage V1 to the driving electrode X2, applies the second alternating current voltage V2 having the amplitude VL smaller than the amplitude of the first alternating current voltage V1 to the driving electrodes X1 and X3, and applies the second alternating current voltage V2 having the same amplitude VD as the first alternating current voltage V1 to the remaining driving electrodes X4 to Xn. Three driving electrodes X (X1 to X3) to which the second alternating current voltages V2 having the amplitude VH and amplitude VL are applied are an example of a group of driving electrodes in the present invention. Three capacitors formed between the detection electrode Y1 and the three driving electrodes X1 to X3 are arranged on the detection electrode Y1.

Figure 17:
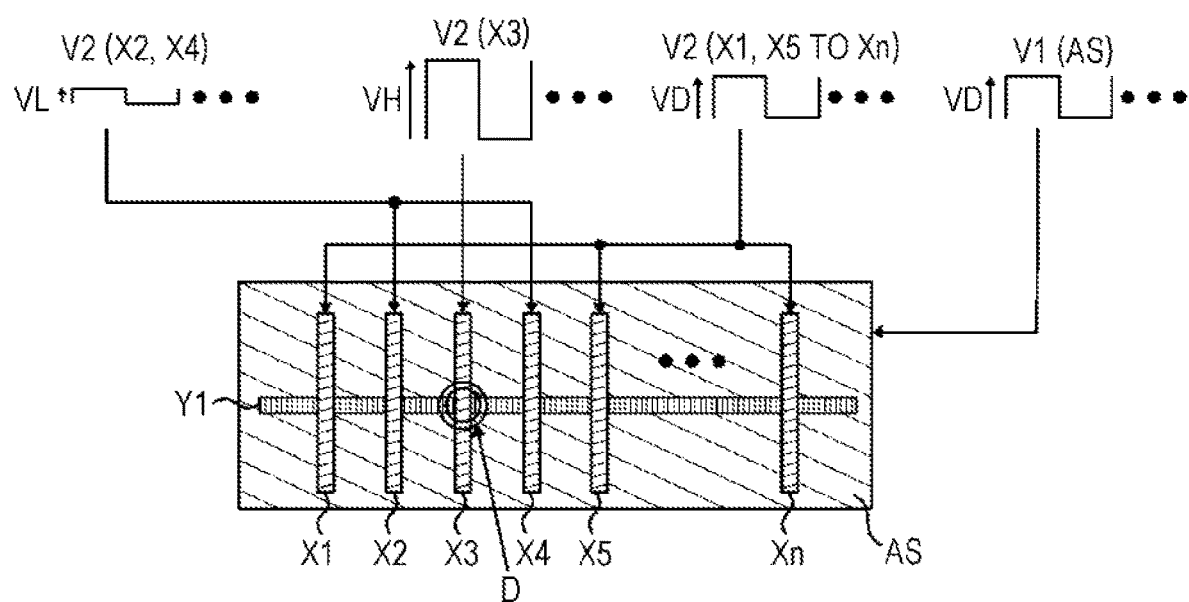
FIG. 17 illustrates an example of a next amplitude pattern switched after the amplitude pattern in FIG. 16.

FIG. 17 illustrates an example of a next amplitude pattern P2 switched after the amplitude pattern P1 in FIG. 16. In the amplitude pattern P2 in FIG. 17, the second alternating current voltage V2 having the amplitude VH is applied to the driving electrode X3, the second alternating current voltage V2 having the amplitude VL is applied to the driving electrodes X2 and X4, and the second alternating current voltage V2 having the amplitude VD is applied to the remaining driving electrodes X1 and X5 to Xn. That is, due to a switchover from the amplitude pattern P1 to P2, three driving electrodes X (or a group of driving electrodes X) to which the second alternating current voltages V2 having the amplitudes VH and VD are applied are shifted by one position horizontally. Subsequently, the group of driving electrodes X is similarly shifted horizontally each time the amplitude pattern is switched.

Figure 18:
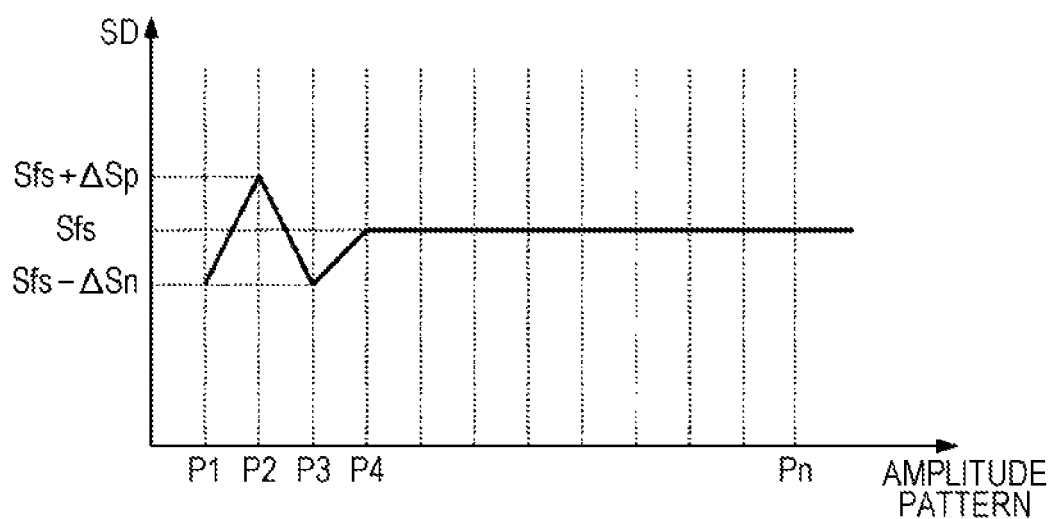
FIG. 18 illustrates an example of detected values that change according to the amplitude pattern.

FIG. 18 indicates an example of detected values SD that change according to the amplitude pattern and also indicates detected values SD in a case in which a finger is close to the position D in FIGS. 16 and 17.

Sfs, Sfs−ΔSn, and Sfs+ΔSp in FIG. 18 indicate the same detected values SD as detected values SD indicated by the same symbols in FIG. 15. In the amplitude pattern P1, the detected value SD becomes a value (Sfs−ΔSn) smaller than Sfs. In the amplitude pattern P2, the detected value SD becomes a value (Sfs+ΔSp) larger than Sfs. In the amplitude pattern P3, the detected value SD becomes a value (Sfs−ΔSn) smaller than Sfs again. In an amplitude pattern P4 and later, the detected value SD becomes a value substantially close to Sfs.

As described above, with the input device according to this embodiment, it makes possible to obtain different detection signals S for one driving electrode X by using amplitude patterns having different polarities of a change in charge corresponding to a change in mutual capacitance Cxy, as in the already-described second embodiment. Therefore, by comparing these different detection signals S, it makes possible to detect a change in mutual capacitance Cxy due to the proximity of an object with superior sensitivity and to enhance precision with which the position of an object is detected.

With the input device according to this embodiment, when the second alternating current voltage V2 having the amplitude VH is applied to one driving electrode X in one amplitude pattern, the second alternating current voltage V2 having the amplitude VL is applied to the one driving electrode X in amplitude patterns before and after the one amplitude pattern. Therefore, when an object is close to a capacitor between the one driving electrode X and the detection electrode Y, it makes possible to highlight a change in the detection signal S, the change being caused by a switchover of an amplitude pattern.

Fourth Embodiment

Next, a fourth embodiment of the present invention will be described. An input device according to the fourth embodiment also has a structure similar to that of the input device (see FIGS. 1 to 4) according to the first embodiment. A difference between them is in the amplitude pattern, set by the control unit 21, of the second alternating current voltage V2.

Figure 19:
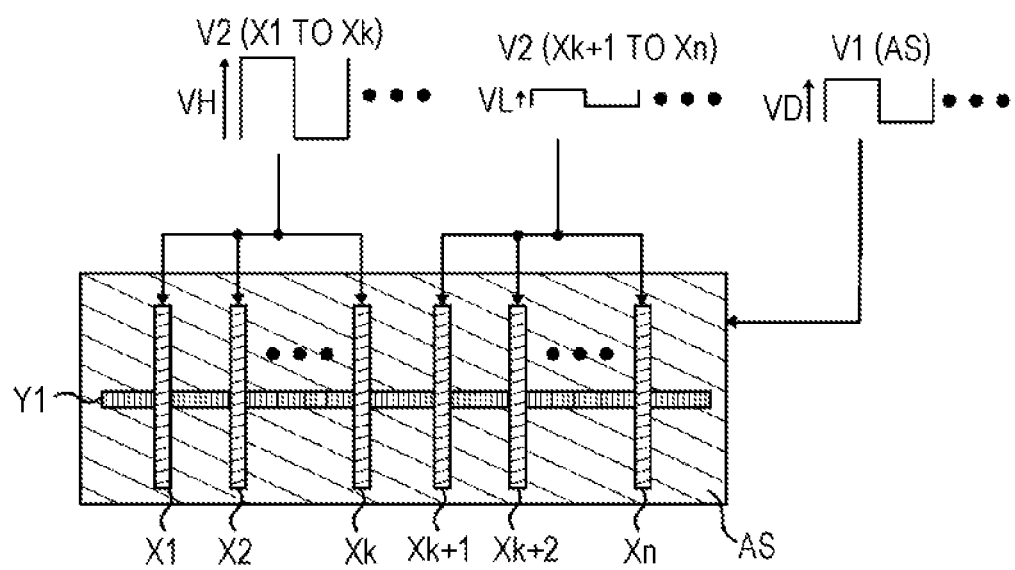
FIG. 19 illustrates an example of an amplitude pattern in a fourth embodiment.

FIG. 19 illustrates an example of the amplitude pattern of the second alternating current voltage V2 in the input device according to this embodiment. As illustrated in FIG. 19, the control unit 21 applies the second alternating current voltage V2 having the amplitude VH (>VD) to the driving electrodes X1 to Xk in each amplitude pattern so that charge to be periodically supplied from the charge detecting unit 22 to the detection electrode Y is minimized when an object such as a finger is not close to the detection area AR, and also applies the second alternating current voltage V2 having the amplitude VL (<VD) to the remaining driving electrodes Xk+1 to Xn. In each amplitude pattern, the control unit 21 may make a match between the number of driving electrodes X from X1 to Xk to which to apply the second alternating current voltage V2 having the amplitude VH and the number of driving electrodes X from Xk+1 to Xn to which to apply the second alternating current voltage V2 having the amplitude VL. For example, in each amplitude pattern, the control unit 21 set an intermediate value between the amplitude VH and the amplitude VL so that the intermediate value matches the amplitude VD of the first alternating current voltage V1.

In each amplitude pattern, a boundary between a driving electrode X to which to apply the second alternating current voltage V2 having the amplitude VH and another driving electrode X to which to apply the second alternating current voltage V2 having the amplitude VL is set at one place or two places. While shifting the position of the above boundary by switching the amplitude pattern, the control unit 21 causes the charge detecting unit 22 to create a detection signal S. The proximity position of the object on the detection electrode Y is identified on the basis of a relationship between the detection signal S and the position of the above boundary.

With the input device according to this embodiment, the amplitude VH of the second alternating current voltage V2 to be applied to a group of electrodes X becomes larger than the amplitude VD of the first alternating current voltage V1 and the amplitude VL of the second alternating current voltage V2 to be applied to the remaining electrodes X becomes smaller than the amplitude VD of the first alternating current voltage V1. Due to this, the polarity of charge is opposite between when the charge is supplied to a capacitor having mutual capacitance formed between the detection electrode Y and one driving electrode X in a group of driving electrodes and when the charge is supplied to a capacitor having mutual capacitance formed between the detection electrode Y and one of the remaining driving electrodes. Therefore, these charges are mutually cancelled. Furthermore, since the number of driving electrodes X in the group and the number of remaining driving electrodes X are equal to each other, the amount of charge to be supplied to all capacitors formed between the detection electrode Y and the group of driving electrodes X and the amount of charge to be supplied to all capacitors formed between the detection electrode Y and the remaining driving electrodes X become nearly equal to each other and the sum of both charges becomes small. Therefore, since the total amount of charge to be supplied to these capacitors becomes small regardless whether an object is close, the offset component of the detection signal S can be made minute.

Fifth Embodiment

Next, a fifth embodiment of the present invention will be described. An input device according to the fifth embodiment also has a structure similar to that of the input device (see FIGS. 1 to 4) according to the first embodiment. A difference between them is in the amplitude pattern, set by the control unit 21, of the second alternating current voltage V2 and in the operation of the processing unit 30 (see FIG. 1).

Figure 20A:
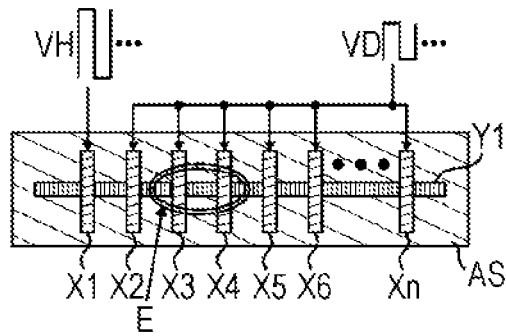
FIGS. 20A to 20F each illustrate an example of an amplitude pattern in a fifth embodiment.
Figure 20D:
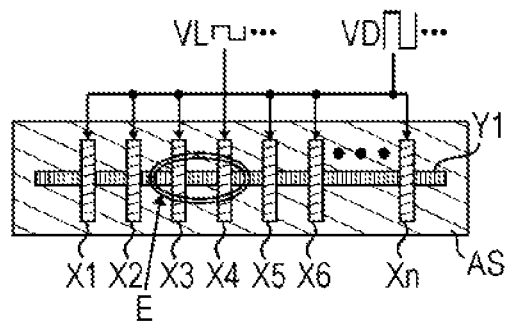
Figure 20B:
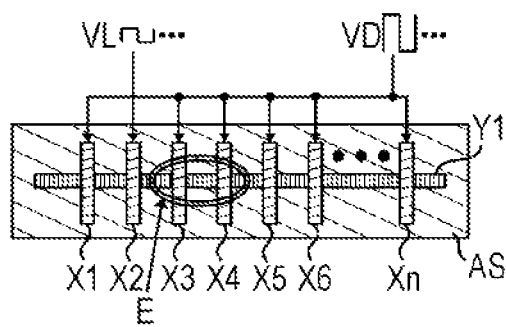
Figure 20E:
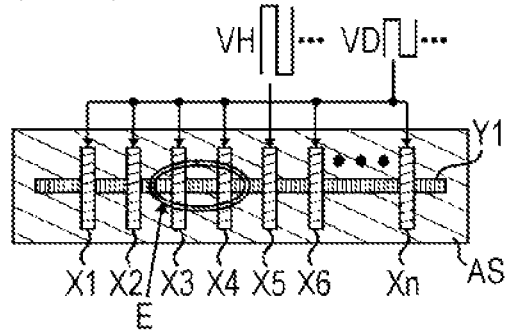
Figure 20C:
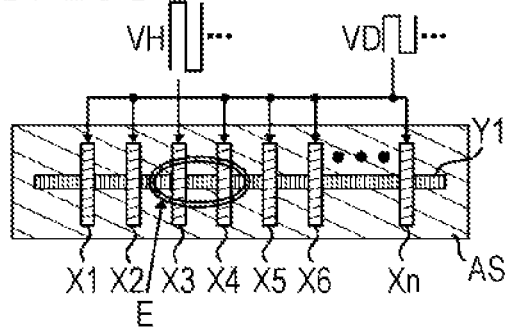
Figure 20F:
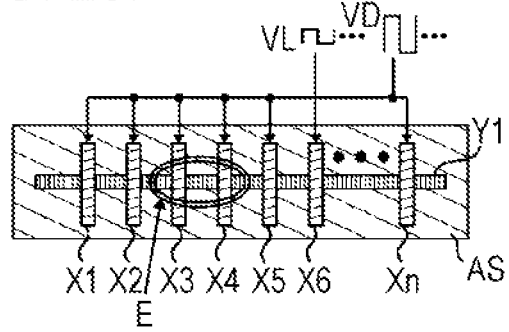

FIGS. 20A to 20F each illustrate an example of the amplitude pattern of the second alternating current voltage V2 in the input device according to this embodiment. In this embodiment, amplitude patterns may be classified into two types, first amplitude patterns and second amplitude patterns. In the example in FIGS. 20A to 20F, amplitude patterns P1, P3, P5, . . . with reference characters including an odd number are first amplitude patterns and amplitude patterns P2, P4, P6, . . . with reference characters including an even number are second amplitude patterns. FIGS. 20A, 20C, and 20E indicate the first amplitude patterns P1, P3, and P5. FIGS. 20B, 20D, and 20F indicate the second amplitude patterns P2, P4, and P6.

When the amplitude pattern is a first amplitude pattern, the control unit 21 may apply the second alternating current voltage V2 having a first amplitude to one driving electrode X and may also apply the second alternating current voltage V2 having a third amplitude to the remaining driving electrodes X. When the amplitude pattern is a second amplitude pattern, the control unit 21 may apply the second alternating current voltage V2 having a second amplitude smaller than the first amplitude to one driving electrode X and may also apply the second alternating current voltage V2 having the third amplitude, which is the same as in the first amplitude pattern, to the remaining driving electrodes X. In the example in FIGS. 20A to 20F, the first amplitude is VH, the second amplitude is VL, and the third amplitude is VD. These amplitudes are the same as in the embodiments described earlier; of these amplitudes, the amplitude VH is largest, followed by the amplitude VD and amplitude VL in that order. It is preferable for the third amplitude to be equal to the amplitude VD of the first alternating current voltage V1.

Here, one driving electrode X to which the second alternating current voltage V2 having the first amplitude VH is applied in the first amplitude pattern will be referred to as a first driving electrode X, and a capacitor formed between the first driving electrode X and the detection electrode Y will be referred to as a first capacitor. Similarly, one driving electrode X to which the second alternating current voltage V2 having the second amplitude VL is applied in the second amplitude pattern will be referred to as a second driving electrode X, and a capacitor formed between the second driving electrode X and the detection electrode Y will be referred to as a second capacitor. As illustrated in FIGS. 20A to 20F, first driving electrodes X (driving electrodes X1, X3, X5, . . . ) and second driving electrodes X (X2, X4, X6, . . . ) are alternately arranged in a direction in which the detection electrode Y extends. Therefore, first capacitors and second capacitors may be alternately arranged in the detection area AR. That is, in the detection area AR, first capacitors and second capacitors that have a positional relationship in which they are adjacent to each other are present.

The processing unit 30 calculates the degree of the proximity of an object at a position at which a first capacitor and a second capacitor are adjacent to each other, according to the difference between the detection signal S (that is, detected value SD) in the first amplitude pattern and that in the second amplitude pattern, the first amplitude pattern and second amplitude pattern forming a relationship in which first capacitors and second capacitors are adjacent to each other in the detection area AR. For example, the processing unit 30 calculates a difference between detected values SD for each pair of a first amplitude pattern and a second amplitude pattern, in which first capacitors and second capacitors are adjacent to each other in the detection area AR.

Figure 21A:
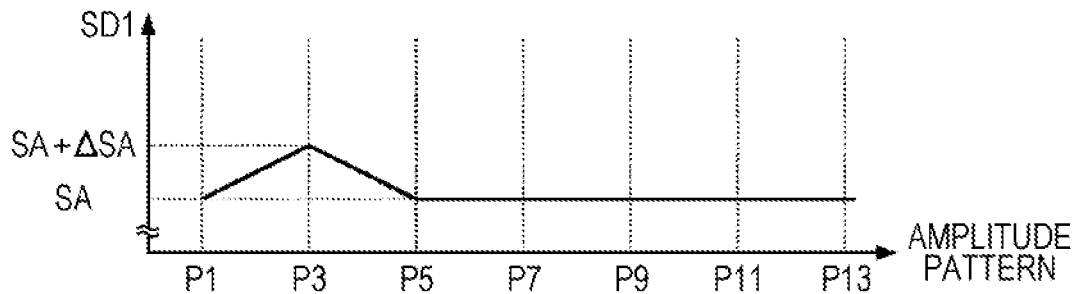
FIGS. 21A to 21C each illustrate an example of detected values that change according to the amplitude pattern.
Figure 21B:
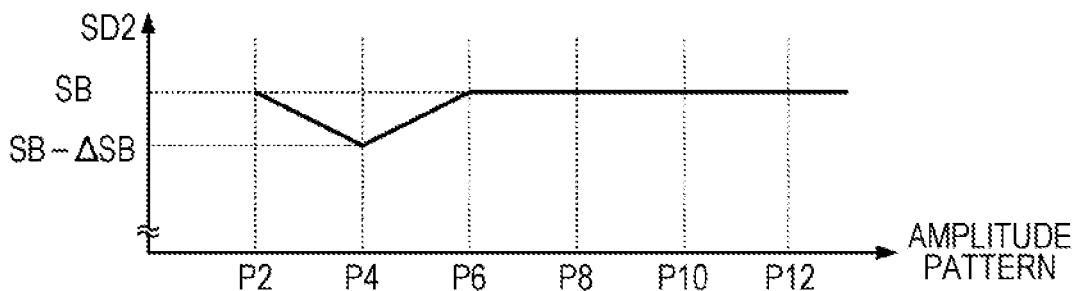
Figure 21C:
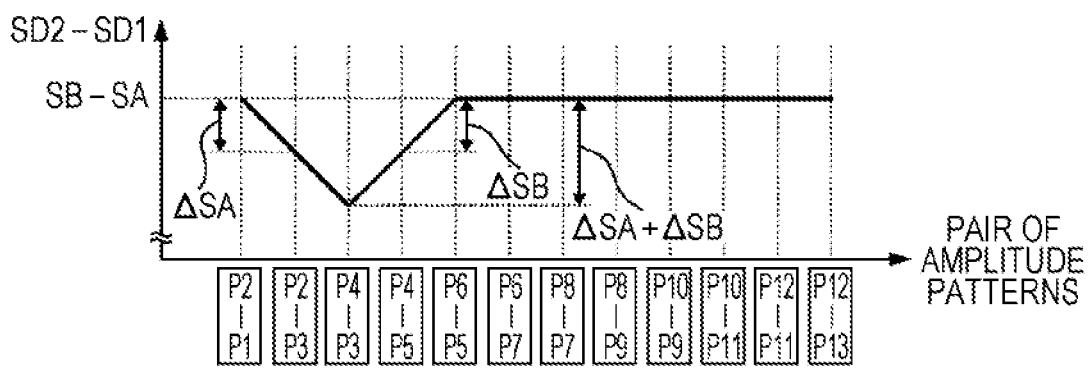

FIGS. 21A to 21C each illustrate an example of detected values that change according to the amplitude patterns. Specifically, these drawings illustrate detected values in a case in which a finger is close to the position E in FIGS. 20A to 20F. FIG. 21A indicates detected values SD1 for first amplitude patterns (P1, P3, P5, . . . ). FIG. 21B indicates detected values SD2 for second amplitude patterns (P2, P4, P6, . . . ). FIG. 21C indicates the difference SD2−SD1 between the detected value SD2 and detected value SD1, the difference being calculated for each pair of a first amplitude pattern and second amplitude pattern, in which first capacitors and second capacitors are adjacent to each other in the detection area AR.

SA in FIG. 21A indicates a detected value SD in a case in which an object is close to the intersection between the detection electrode Y and a driving electrode X to which the third amplitude VD has been applied in the first amplitude pattern, and corresponds to charge Qy1″ in equation (3). SA+ΔSA in FIG. 21A indicates a detected value SD in a case in which an object is close to the intersection (that is, the first capacitor) between the detection electrode Y and the first driving electrode X to which the first amplitude VH has been applied in the first amplitude pattern, and corresponds to Qy1′ in equation (2). Therefore, ΔSA in FIG. 21A corresponds to charge (VH−VD)×CP, which is the difference between charge Qy1′ in equation (2) and charge Qy1″ in equation (3).

SB in FIG. 21B indicates a detected value SD in a case in which an object is close to the intersection between the detection electrode Y and a driving electrode X to which the third amplitude VD has been applied in the second amplitude pattern, and corresponds to charge QBy1″ resulting from replacing VH in equation (3) with VL. Charge QBy1″ is represented by the equation below.

$$QBy1'' = (VD-VL) \times Cx1y1 + VD \times Cfs \quad (21)$$

As seen from a comparison between equation (3) and equation (21), SB is larger than SA.

SB−ΔSB in FIG. 21A indicates a detected value SD in a case in which an object is close to the intersection (that is, the second capacitor) between the detection electrode Y and a second driving electrode X to which the second amplitude VL has been applied in the second amplitude pattern, and corresponds to charge QBy1′ resulting from replacing VH in equation (2) with VL. Charge QBy1′ is represented by the equation below.

$$QBy1' = (VD-VL) \times (Cx1y1-Cp) + VD \times Cfs \quad (22)$$

Therefore, ΔSB in FIG. 21B corresponds to charge (VD−VL)×Cp, which is the difference between charge QBy1″ in equation (21) and charge QBy1′ in equation (22).

As shown in FIG. 21C, in a pair of amplitude patterns in which an object is close to neither a first capacitor nor a second capacitor, the difference SD2−SD1 in detected values becomes about SB−SA. However, in a pair of amplitude patterns in which an object is close to at least one of a first capacitor and a second capacitor, the difference SD2−SD1 in detected values becomes smaller than SB−SA. An amount by which SB−SA is reduced is ΔSA in a pair of amplitude patterns (P2 and P3), ΔSA+ΔSB in a pair of amplitude patterns (P4 and P3), and ΔSB in a pair of amplitude patterns (P4 and P5). In the pair of patterns (P4 and P3) in which a finger is close to both a first capacitor and a second capacitor, as respective changes in mutual capacitances are combined, the difference SD2−SD1 in detected values is more significantly reduced than SB−SA. Therefore, a change in mutual capacitance due to the proximity of an object is detected with high sensitivity.

As described above, with the input device according to this embodiment, as the amplitude of the second alternating current voltage V2 to be applied differs between the first capacitor formed between a first driving electrode X and the detection electrode Y in the first amplitude pattern and the second capacitor formed between a second driving electrode X and the detection electrode Y in the second amplitude pattern, the amount of change in charge corresponding to respective changes in the capacitances (specifically, mutual capacitances) differs. Since first capacitors and second capacitors are alternately arranged in the detection area AR, first capacitors and second capacitors that have a positional relationship in which they are mutually adjacent are present in the detection area AR. Therefore, it is possible to calculate the degree of the proximity of an object such as a finger at a position at which a first capacitor and a second capacitor are adjacent to each other, according to the difference between the detection signal S (that is, detected value SD) in the first amplitude pattern and that in the second amplitude pattern, the first amplitude pattern and second amplitude pattern forming a relationship in which first capacitors and second capacitors are adjacent to each other in the detection area AR.

The present invention is not limited to the embodiments described above, but includes various variations.

The numbers of individual members (driving electrodes, detection electrodes, shield electrode, and the like) taken as examples in the embodiments described above as well as the shapes, sizes, positional relationships, and the like of these members are just examples. The present invention is not limited to these examples. For example, the number of detection electrodes may be 1. The shield electrode may be omitted.

The structures of electronic circuits and the like taken as examples in the embodiments described above are just examples and can be embodied by other various means that can achieve similar operations such as hardware, firmware, software, or a combination of them. In hardware, these structures can be embodied by, for example, one or more application-specific integrated circuits (ASICs), digital signal processors (DSPs), digital signal processing devices (DSPDs), programmable logic devices (PLDs), field-programmable gate arrays (FPGAs), processors, controllers, microcontrollers, microprocessors, or the like.

Although, in the embodiments described above, a user interface device is taken as an example, the present invention is not limited to this. The present invention can be widely applied to various devices that inputs information corresponding to a change in capacitance that is caused by a change in the position of an object (such as, for example, an inspection device that inspects the position of an object).

What is claimed is:

1. An input device that inputs information corresponding to a change in capacitance that is caused by a change in a position of an object in a detection area, the input device comprising:
   a detection electrode placed in the detection area;
   a plurality of driving electrodes placed in the detection area, a capacitor being formed between the detection electrode and each of the plurality of driving electrodes;
   a charge detecting unit that periodically supplies charge to the detection electrode so that a first alternating current voltage is generated in the detection electrode, and outputs a detection signal corresponding to the supplied charge;
   a driving unit that applies a second alternating current voltage, which has the same frequency and phase as the first alternating current voltage, to the each of the plurality of driving electrodes, and is capable of changing an amplitude of the second alternating current voltage for each driving electrode; and
   a control unit that switches an amplitude pattern, which is a combination of amplitudes of the second alternating current voltages to be applied to each of the plurality of driving electrodes by the driving unit; wherein
   the control unit
      switches the amplitude pattern according to a predetermined series of amplitude patterns, and
      in each amplitude pattern included in the series, applies the second alternating current voltage having a certain amplitude to each of remaining driving electrodes resulting from excluding one driving electrode or a group of driving electrodes, and also applies the second alternating current voltage having a different amplitude from the remaining driving electrode to the one driving electrode or the group of driving electrodes.

2. The input device according to claim 1, wherein in each amplitude pattern included in the series, the control unit applies, to the remaining driving electrodes, the second alternating current voltage having the same amplitude as the first alternating current voltage.

3. The input device according to claim 2, wherein, in each amplitude pattern included in the series, the control unit applies, to one driving electrode or the group of driving electrodes, the second alternating current voltage having an amplitude larger than the amplitude of the first alternating current voltage.

4. The input device according to claim 2, wherein, in each amplitude pattern included in the series, the control unit applies, to one part included in the group of driving electrodes, the second alternating current voltage having an amplitude larger than the amplitude of the first alternating current voltage, and also applies, to another part included in the group of driving electrodes, the second alternating current voltage having an amplitude smaller than the amplitude of the first alternating current voltage.

5. The input device according to claim 4, wherein, in each amplitude pattern included in the series, the control unit applies, to one of two driving electrodes around which positions of the capacitors are adjacent, the second alternating current voltage having an amplitude larger than the amplitude of the first alternating current voltage, and also applies, to another of the two driving electrodes, the second alternating current voltage having an amplitude smaller than the amplitude of the first alternating current voltage.

6. The input device according to claim 1, wherein in each amplitude pattern included in the series, the control unit makes a match between a number of driving electrodes in the group and a number of remaining driving electrodes, makes the amplitude of the second alternating current voltage to be applied to the group of driving voltages larger than an amplitude of the first alternating current voltage, and makes the amplitude of the second alternating current voltage to be applied to the remaining driving voltages smaller than the amplitude of the first alternating current voltage.

7. The input device according to claim 1, wherein:
   each amplitude pattern included in the series is any of a first amplitude pattern and a second amplitude pattern;

the control unit
- when the amplitude pattern is a first amplitude pattern, applies the second alternating current voltage having a first amplitude to the one driving electrode, and also applies the second alternating current voltage having a third amplitude to the remaining driving electrodes, and
- when the amplitude pattern is a second amplitude pattern, applies the second alternating current voltage having a second amplitude, which is smaller than the first amplitude, to the one driving electrode, and also applies the second alternating current voltage having the third amplitude to the remaining driving electrodes; and the capacitor formed between the one driving electrode and the detection electrode in the first amplitude pattern and the capacitor formed between the one driving electrode and the detection electrode in the second amplitude pattern are alternately arranged in the detection area.

8. The input device according to claim 1, further comprising:
- a shield electrode placed adjacent to the detection electrode; and
- a voltage generating unit that generates the first alternating current voltage and applies the first alternating current voltage to the shield electrode.

9. The input device according to claim 8, wherein the capacitance detecting unit supplies charge to the detection electrode so that the detection electrode and the shield electrode have the same voltage, and outputs the detection signal corresponding to the supplied charge.

10. The input device according to claim 1, comprising a plurality of the detection electrodes.

11. The input device according to claim 1, wherein a surface of the detection area includes a manipulation surface manipulated by a manipulator.

12. A method of controlling an input device that inputs information corresponding to a change in capacitance that is caused by a change in a position of an object in a detection area, wherein:

the input device comprises
- a detection electrode placed in the detection area,
- a plurality of driving electrodes placed in the detection area, a capacitor being formed between the detection electrode and each of the plurality of driving electrodes,
- a charge detecting unit that periodically supplies charge to the detection electrode so that a first alternating current voltage is generated in the detection electrode, and outputs a detection signal corresponding to the supplied charge, and
- a driving unit that applies a second alternating current voltage, which has the same frequency and phase as the first alternating current voltage, to each of the plurality of driving electrodes, and is capable of changing an amplitude of the second alternating current voltage for each driving electrode; and the method of controlling the input device comprises
- switching an amplitude pattern, which is a combination of amplitudes of the second alternating current voltages to be applied to each of the plurality of driving electrodes by the driving unit, according to a predetermined series of amplitude patterns, and
- applying the second alternating current voltage having a certain amplitude to each of remaining driving electrodes resulting from excluding one driving electrode or a group of driving electrodes, and also applying the second alternating current voltage having a different amplitude from the remaining driving electrode to the one driving electrode or the group of driving electrodes.

* * * * *